(12) United States Patent
Murata et al.

(10) Patent No.: US 8,847,124 B2
(45) Date of Patent: Sep. 30, 2014

(54) HEATING DEVICE HAVING A MEANDER-SHAPED HEATING ELEMENT WITH AN INSULATING BODY ACCOMODATING THE SAME, AND THE SUBSTRATE PROCESSING APPARATUS INCLUDING THE SAME

(75) Inventors: Hitoshi Murata, Toyama (JP); Tetsuya Kosugi, Toyama (JP); Shinobu Sugiura, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 198 days.

(21) Appl. No.: 12/748,920

(22) Filed: Mar. 29, 2010

(65) Prior Publication Data

US 2011/0021038 A1 Jan. 27, 2011

(30) Foreign Application Priority Data

Jul. 21, 2009 (JP) ................................. 2009-169938

(51) Int. Cl.
*H05B 3/02* (2006.01)

(52) U.S. Cl.
USPC ....................................................... 219/538

(58) Field of Classification Search
CPC . H01L 21/67109; F27B 17/0025; F27B 5/16; C30B 31/12; C30B 15/14
USPC ............ 219/538, 546; 438/795; 257/E21.328
See application file for complete search history.

(56) References Cited

U.S. PATENT DOCUMENTS

| 2007/0007266 A1* | 1/2007 | Sasaki et al. | 219/202 |
| 2009/0035948 A1* | 2/2009 | Miyata et al. | 438/778 |
| 2010/0193505 A1* | 8/2010 | Peck | 219/548 |

FOREIGN PATENT DOCUMENTS

| CN | 1941287 A | 4/2007 |
| JP | 53144544 | 12/1978 |
| JP | 61134271 | 6/1986 |
| JP | 4-080590 | 3/1992 |
| JP | 7-113586 | 5/1995 |
| JP | 11-297627 | 10/1999 |
| JP | 2001 126847 | 5/2001 |
| JP | 2006 100755 | 4/2006 |
| JP | 2006-100755 | 4/2006 |
| JP | 2007-088325 | 4/2007 |
| JP | 2008 218478 | 9/2008 |

* cited by examiner

*Primary Examiner* — Duy T Nguyen
(74) *Attorney, Agent, or Firm* — Brundidge & Stanger, P.C.

(57) ABSTRACT

Provided are a heating device, a substrate processing apparatus, and a method of manufacturing a semiconductor device, which can suppress differences between heating bodies, and simultaneously, can suppress shearing of a holder due to thermal deformation of the heating element. The heating device comprises: a heating element including a mountain part and a valley part that are alternately connected in plurality in a meander shape with both ends being fixed; holding body receiving parts respectively installed at ends of the valley parts and formed as cutout parts having a width larger than a width of the valley part; an insulating body installed at an outer circumference of the heating element; and a holding body disposed in the holding body receiving part and fixed to the insulating body.

7 Claims, 18 Drawing Sheets

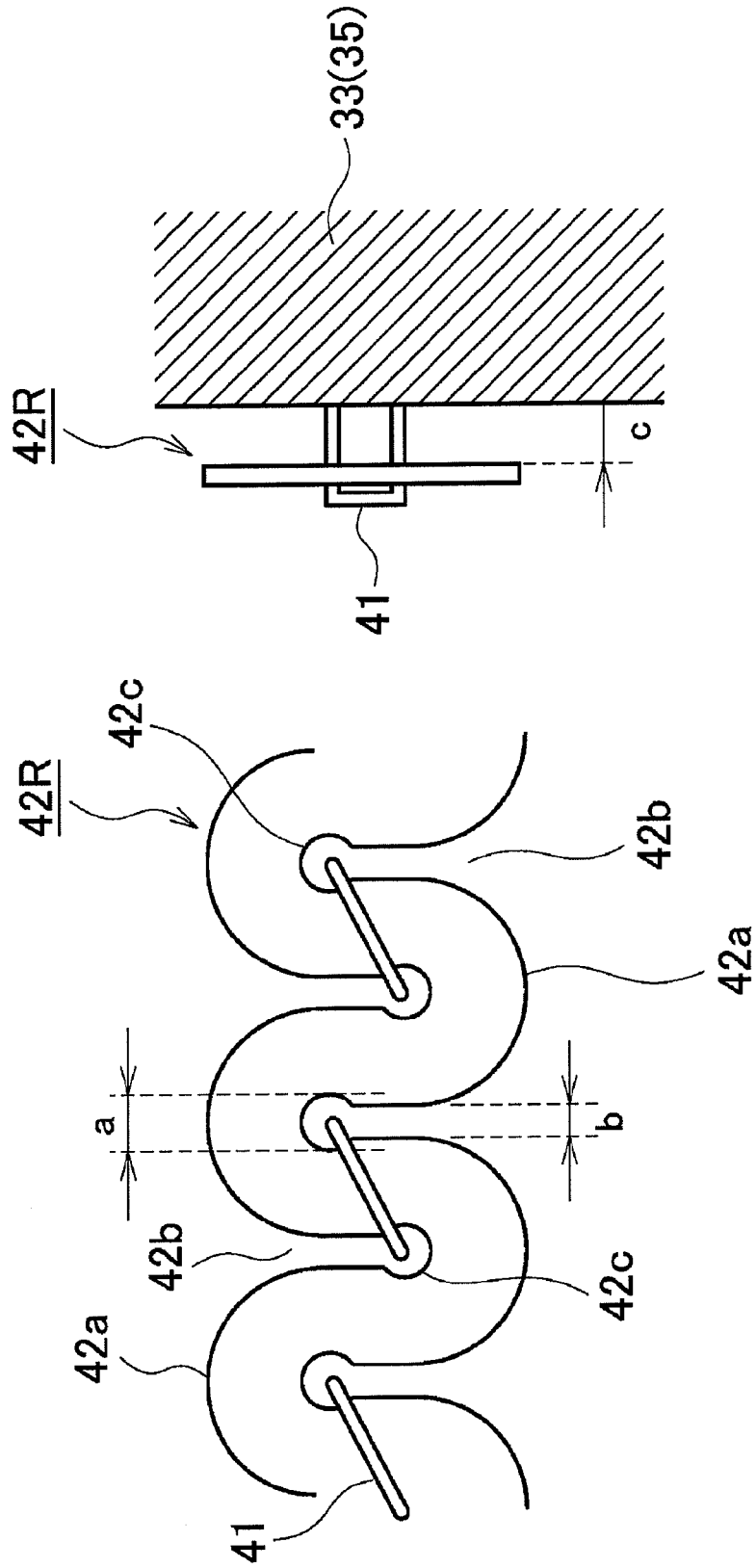

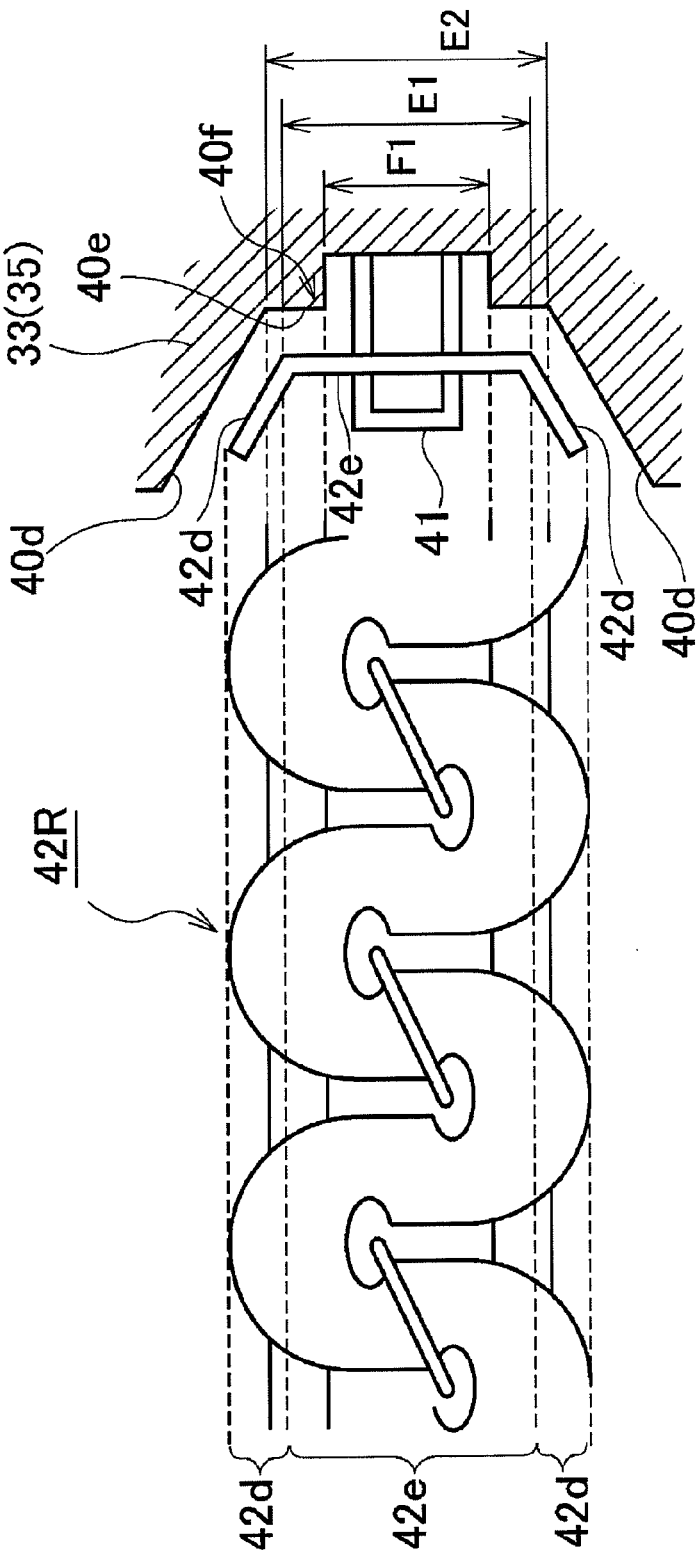

HEATING DEVICE HAVING A MEANDER-SHAPED HEATING ELEMENT WITH AN INSULATING BODY ACCOMODATING THE SAME, AND THE SUBSTRATE PROCESSING APPARATUS INCLUDING THE SAME

CROSS-REFERENCE TO RELATED PATENT APPLICATION

This U.S. non-provisional patent application claims priority under 35 U.S.C. §119 of Japanese Patent Application No. 2009-169938, filed on Jul. 21, 2009, in the Japanese Patent Office, the entire contents of which are hereby incorporated by reference.

BACKGROUND OF THE INVENTION

1. Field of the Invention

The present invention relates to a heating device, a substrate processing apparatus configured to process a substrate, and a method of manufacturing a semiconductor device.

2. Description of the Prior Art

As a process of a method of manufacturing a semiconductor device such as a dynamic random access memory (DRAM), a substrate processing process in which a substrate such as a silicon wafer is heated to be processed has been performed. Such a substrate processing process has been performed by using a substrate processing apparatus, which includes a process chamber configured to accommodate a substrate to process the substrate, and a heating device configured to heat the inside of the process chamber. The heating device includes a ring shaped heating element surrounding the outer circumference of the process chamber, and a ring shaped insulating body installed along the outer circumference of the heating element. Respectively at the upper and lower ends of the heating element, a mountain part and a valley part (cutout part) are alternately connected in plurality to form a meander shape (for example, refer to Patent Document 1 below).

[Patent Document 1]
Japanese Unexamined Patent Application Publication No. 2007-88325

Both ends of the above-described heating element having a ring shape penetrate a side wall of the insulating body and are fixed, and simultaneously, the respective valley parts of the heating element are independently fixed to an inner circumferential side wall of the insulating body, so that the heating element is held to the inner circumferential side of the insulating body. To fix the respective valley parts of the heating element to the inner circumferential side wall of the insulating body, a holding body configured as a pin having, for example, a bridge shape has been used. That is, both ends of the holding body are independently inserted into the ends (valley bottom parts) respectively of the valley parts adjacent to both the ends of the holding body and fixed to the inner circumferential side wall of the insulating body, so as to suppress misaligning of the heating element.

However, in the above-described configuration, when the heating element with temperature being increased is thermally deformed, the gaps between the valley parts decrease, so that a holding opening may be sheared.

SUMMARY OF THE INVENTION

An object of the present invention is to provide a heating device, a substrate processing apparatus, and a method of manufacturing a semiconductor device, which can suppress differences between heating bodies, and simultaneously, suppress shearing of holding openings due to thermal deformation of the heating bodies.

According to an aspect of the present invention, there is provided a heating device comprising: a heating element including a plurality of mountain parts consecutively connected to form a meander shape, each mountain part, of the plurality of mountain parts, including a front end and a holding body receiving part, wherein the front end of the mountain part is bent at an obtuse angle with respect to a portion of the mountain part other than the front end of the mountain part, and wherein a width of the holding body receiving part is larger than a width of a space between two adjacent mountain parts of the plurality of mountain parts: an insulating body surrounding the heating element and comprising a groove disposed on an inner circumferential surface thereof to accommodate the heating element, wherein a first sidewall and a second sidewall of the groove are respectively inclined at the obtuse angle with respect to a bottom surface of the groove such that the groove accommodates the heating element; and a holding body disposed in the holding body receiving part and fixing the heating element to the insulating body, wherein two ends of the heating element are fixed to the insulating body.

According to another aspect of the present invention, there is provided a substrate processing apparatus comprising a heating device and a process chamber installed in the heating device to process a substrate, wherein the heating device comprises: a heating element including a plurality of mountain parts consecutively connected to form a meander shape, each mountain part, of the plurality of mountain parts, including a front end and a holding body receiving part, wherein the front end of the mountain part is bent at an obtuse angle with respect to a portion of the mountain part other than the front end of the mountain part, and wherein a width of the holding body receiving part is larger than a width of a space between two adjacent mountain parts of the plurality of mountain parts: an insulating body surrounding the heating element and comprising a groove disposed on an inner circumferential surface thereof to accommodate the heating element, wherein a first sidewall and a second sidewall of the groove are respectively inclined at the obtuse angle with respect to a bottom surface of the groove such that the groove accommodates the heating element; and a holding body disposed in the holding body receiving part and fixing the heating element to the insulating body, wherein two ends of the heating element are fixed to the insulating body.

According to another aspect of the present invention, there is provided a method of manufacturing a semiconductor device, the method comprising: loading a substrate into a process chamber installed in a heating device; and increasing temperature of a heating element provided to the heating device to heat the substrate in the process chamber in a state where both ends of the heating element including a mountain part and a valley part that are alternately connected in plurality in a meander shape are fixed to an insulating body installed at an outer circumference of the heating element, and simultaneously, holding bodies are disposed in holding body receiving parts respectively installed at ends of the valley parts and formed as cutout parts having a width larger than a width of the valley part, and are fixed to the insulating body, so as to hold a position of the heating element.

BRIEF DESCRIPTION OF THE DRAWINGS

FIG. 6A is a partial enlarged view illustrating the ring shaped part according to a modified example of the first embodiment of the present invention, and FIG. 6B is a side view illustrating an enlarged part of FIG. 6A.

FIG. 13A and FIG. 13B are schematic views illustrating a modified example of a storage part according to the second embodiment of the present invention, FIG. 13A being a partial enlarged view illustrating the storage part accommodating a ring shaped part, FIG. 13B being a side view illustrating an enlarged part of FIG. 13A.

DETAILED DESCRIPTION OF THE PREFERRED EMBODIMENTS

First Embodiment of the Present Invention

A first embodiment of the present invention will be described hereinafter with reference to the attached drawings.

Figure 1:
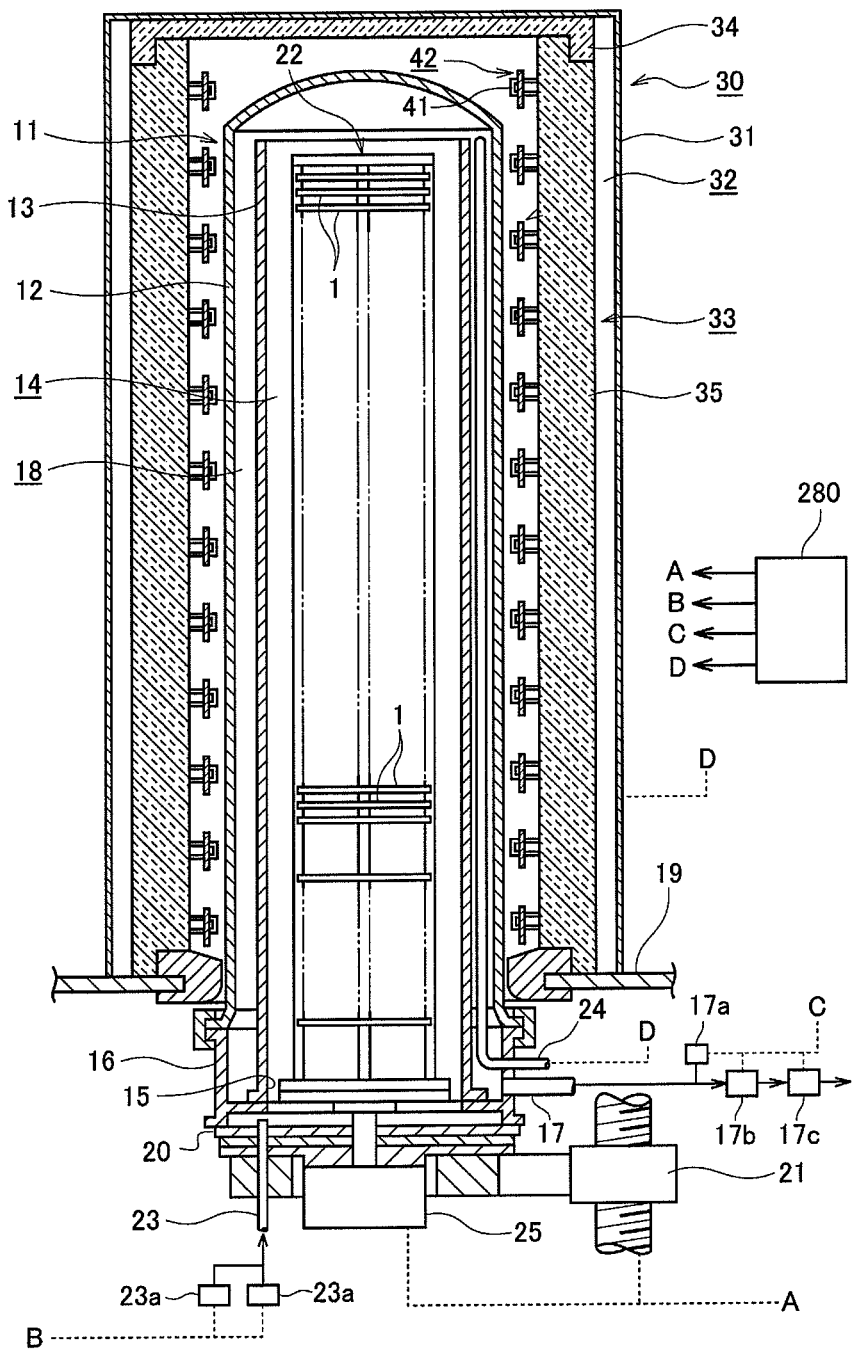
FIG. 1 is a vertical cross-sectional view illustrating a substrate processing apparatus according to a first embodiment of the present invention.
Figure 2:
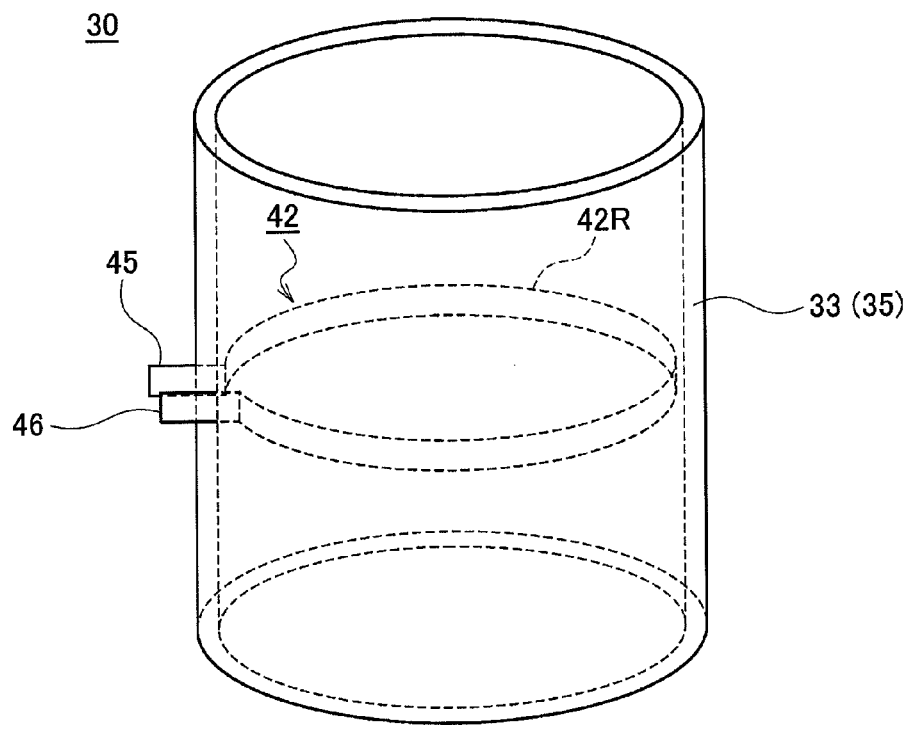
FIG. 2 is perspective view illustrating a heater unit according to the first embodiment of the present invention.
Figure 3:
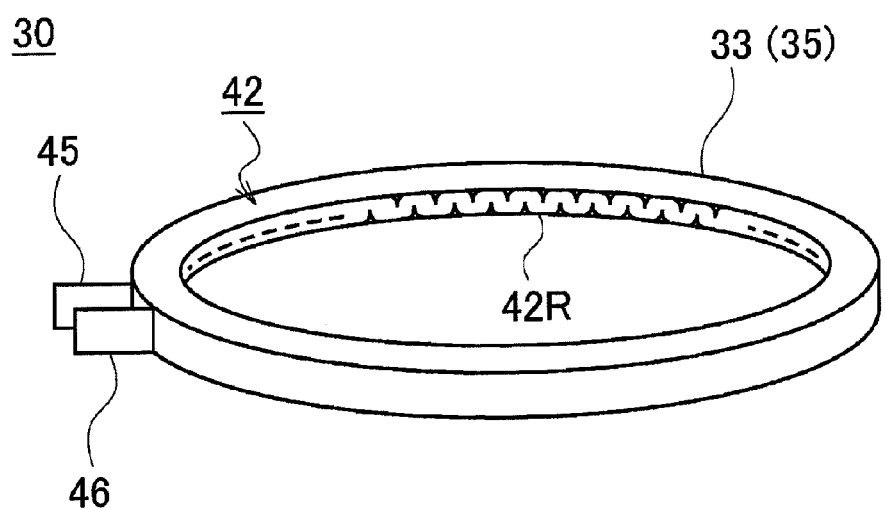
FIG. 3 is a partial enlarged view illustrating the heater unit according to the first embodiment of the present invention.
Figure 4A:
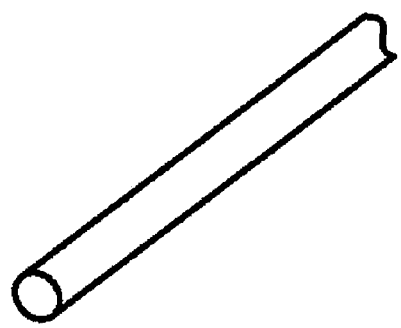
FIG. 4A is a schematic view illustrating a line shaped material constituting a ring shaped part, according to the first embodiment of the present invention.
Figure 4B:
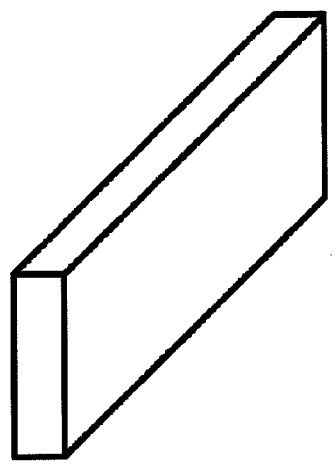
FIG. 4B is a schematic view illustrating a plate shaped material constituting the ring shaped part.
Figure 5B:
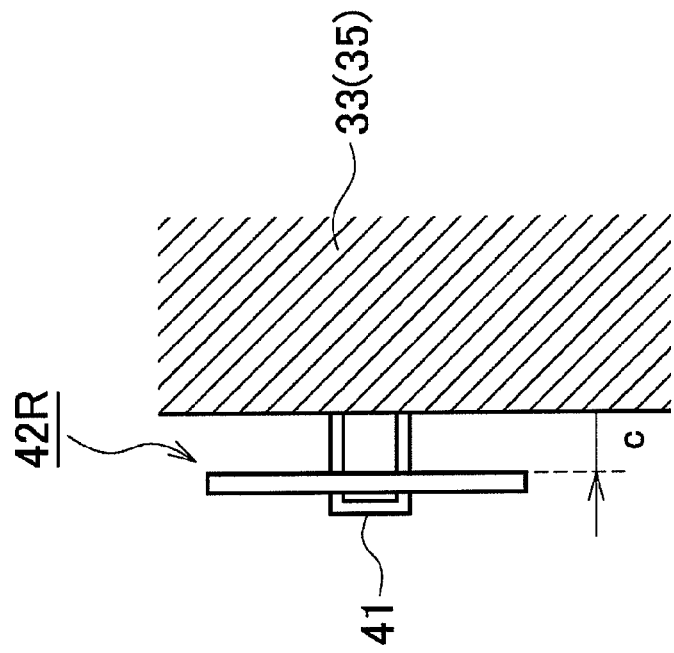
FIG. 5B is a side view illustrating an enlarged part of FIG. 5A.
Figure 5A:
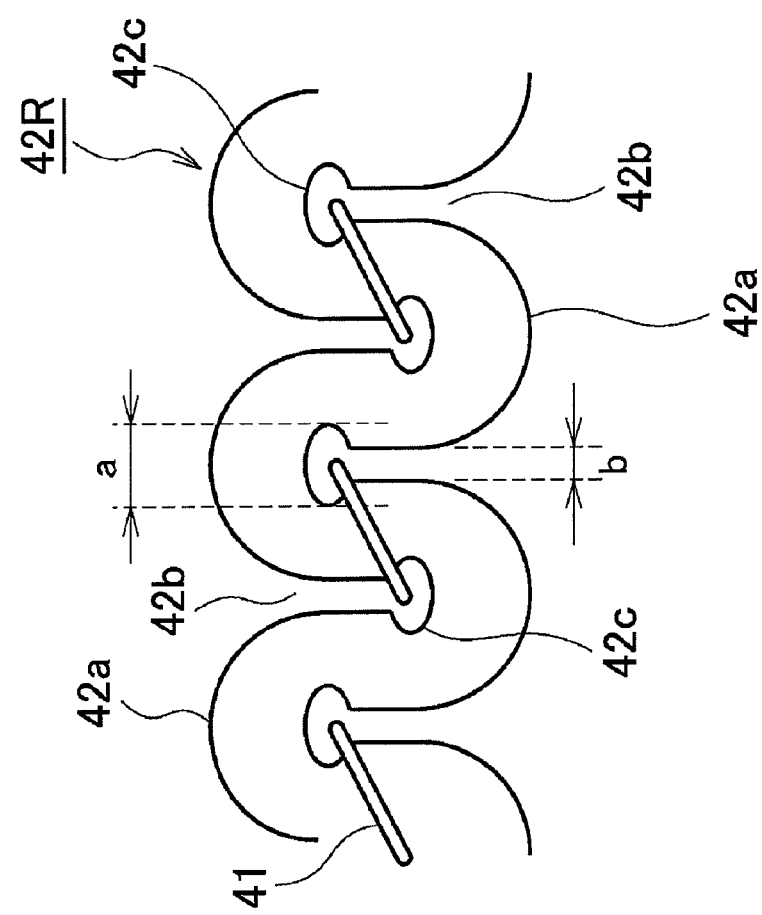
FIG. 5A is a partial enlarged view illustrating the ring shaped part according to the first embodiment of the present invention.

FIG. 1 is a vertical cross-sectional view illustrating a substrate processing apparatus according to the first embodiment of the present invention. FIG. 2 is perspective view illustrating a heater unit according to the first embodiment of the present invention. FIG. 3 is a partial enlarged view illustrating the heater unit according to the first embodiment of the present invention. FIG. 4A is a schematic view illustrating a line shaped material constituting a ring shaped part, according to the first embodiment of the present invention. FIG. 4B is a schematic view illustrating a plate shaped material constituting the ring shaped part. FIG. 5A is a partial enlarged view illustrating the ring shaped part according to the first embodiment of the present invention. FIG. 5B is a side view illustrating an enlarged part of FIG. 5A.

(1) Configuration of Substrate Processing Apparatus

Hereinafter, a configuration of the substrate processing apparatus relevant to one embodiment of the present invention will now be described. As shown in FIG. 1, the substrate processing apparatus relevant to the current embodiment is configured as a batch type vertical hot wall shaped depressurization chemical vapor deposition (CVD) apparatus.

The substrate processing apparatus relevant to the current embodiment includes a vertical process tube 11 that is vertically supported. The process tube 11 includes an outer tube 12 and an inner tube 13. Each of the outer tube 12 and the inner tube 13 is integrally made of a material, for example, such as quartz ($SiO_2$) or silicon carbide (SiC) having high thermal resistance. The outer tube 12 has a cylindrical shape with a closed top side and an opened bottom side. The inner diameter of the outer tube 12 is greater than the inner diameter of the inner tube 13. The outer tube 12, in a manner of surrounding the outside of the inner tube 13, is installed coaxially with the inner tube 13. At the inside of the inner tube 13, a process chamber 14 is formed to accommodate and process wafers 1 that are horizontally stacked in multiple stages by a boat 22 as a substrate holder. A bottom opening of the inner tube 13 constitutes a furnace port 15 configured to load and unload the boat 22.

Between the outer tube 12 and the inner tube 13, the lower end parts each is air-tightly sealed by a manifold 16 having a circular ring shape. The manifold 16 is made of, for example, SUS (stainless steels prescribed in the Japanese Industrial Standard). For replacement of the inner tube 13 and the outer tube 12, the manifold 16 is installed as an attaching/detaching member on each of the inner tube 13 and the outer tube 12. Since the manifold 16 is horizontally supported by a heater base 19, the process tube 11 can be vertically fixed.

An upstream end of an exhaust pipe 17 is connected to a side wall of the manifold 16. The inside of the exhaust pipe 17 communicate with the inside of an exhaust passage 18 that is formed as a cylindrical hollow body (gap) between the inner tube 13 and the outer tube 12. The horizontal cross-sectional shape of the exhaust passage 18 is, for example, a circular ring shape having a constant width. The exhaust pipe 17 is connected to the lowermost part of the exhaust passage 18 as a cylindrical hollow body. At the exhaust pipe 17, in order from the upstream, a pressure sensor 17a, an auto pressure controller (APC) valve 17b as a pressure regulating valve, and a vacuum exhaust device 17c are installed. The vacuum exhaust device 17c is operated to control an opened area of the APC valve 17b based on pressure detected by the pressure sensor 17a, so that the pressure in the process chamber 14 can be maintained at a predetermined pressure (vacuum degree). Mainly, the exhaust pipe 17, the pressure sensor 17a, the APC valve 17b, and the vacuum exhaust device 17c constitute an exhaust line configured to exhaust atmosphere in the process chamber 14. The pressure sensor 17a, the APC valve 17b, the vacuum exhaust device 17c are connected to a controller 280 as a control unit. The controller 280 is configured to control the opened area of the APC valve 17b based on pressure information detected by the pressure sensor 17a such that the pressure in the process chamber 14 can be maintained at a predetermined process pressure.

A circular plate shaped seal cap 20 configured to close a bottom opening of the manifold 16 is in contact with the manifold 16 from the lower side of the manifold 16 along the vertical direction. The seal cap 20 is configured such that the outer diameter of the seal cap 20 is substantially the same as the outer diameter of the outer tube 12 and the outer diameter of the manifold 16. The seal cap 20 is configured to be vertically lifted and lowered by a boat elevator 21 (partially shown) installed at the outside of the process tube 11. At the lower side of the seal cap 20, a rotary mechanism 25 is installed. A rotation shaft of the rotary mechanism 25 vertically penetrates the seal cap 20. On the rotation shaft of the rotary mechanism 25, the above-described boat 22 is vertically based and supported. As described above, the boat 22 is configured to hold a plurality of wafers 1 in a state where the wafers 1 are horizontally oriented and stacked in multiple stages with their centers being aligned.

By operating the rotary mechanism 25, the boat 22 can be rotated in the process chamber 14.

A gas introduction pipe 23 is vertically connected to the seal cap 20. A raw material supply device 23a and a carrier gas supply device 23b each is connected to an upstream end (lower end) of the gas introduction pipe 23. A downstream end (upper end) of the gas introduction pipe 23 is configured to supply (eject) gas toward the inside of the process chamber 14. Gas supplied from the gas introduction pipe 23 into the process chamber 14 (into the inner tube 13) flows on the surface of each wafer 1 held in the process chamber 14, flows from a top opening of the inner tube 13 into the exhaust passage 18, and then, is exhausted from the exhaust pipe 17. Mainly, the gas introduction pipe 23, the raw material supply device 23a, and the carrier gas supply device 23b constitute a gas supply line configured to supply gas into the process chamber 14. The raw material supply device 23a and the carrier gas supply device 23b are connected to the controller 280. The controller 280 controls the raw material supply device 23a and the carrier gas supply device 23b, and is configured to supply flow raw material gas and carrier gas at a predetermined time at a predetermined flowrate into the process chamber 14.

In addition, at the gap between the outer tube 12 and the inner tube 13, a temperature sensor 24 is vertically installed. The temperature sensor 24 is connected to the controller 280.

The controller 280 controls, based on temperature information detected by the temperature sensor 24, the power condition of each of heating bodies 42 included by a heater unit 30 to be described later (controls power supply performed by a couple of power feed parts 45 and 46) to maintain the surface temperature of the wafer 1 held in the process chamber 14, at a predetermined process temperature.

(2) Configuration of Heater Unit

At the outside of the outer tube 12, the heater unit 30 as a heating device configured to heat the inside of the process tube 11 is installed in a manner of surrounding the outer tube 12. The heater unit 30 includes the heating bodies 42, an insulating body 33, holding bodies 41, and a case 31.

One or more heating bodies 42 are vertically installed in the manner of surrounding the outer tube 12. As shown in FIG. 2 and FIG. 3, the heating bodies 42 each includes a ring shaped part 42R and the couple of power feed parts 45 and 46. The ring shaped part 42R is configured to have a ring shape in the manner of surrounding the outer circumference of the outer tube 12. Both end parts of the ring shaped part 42R are fixed in a state where they are close to each other without contact, and are in electrically non-contact with each other. That is, the ring shaped part 42R is configured to electrically have an imperfect circular shape, for example, a C-shaped ring shape. As a material constituting the ring shaped part 42R, a resistance heating material, for example, such as Fe—Cr—Al alloy, $MOSi_2$, and SiC may be used, and the shape of the material may be a line shape as shown in FIG. 4A, or be a plate shape as shown in FIG. 4B. The couple of power feed parts 45 and 46 penetrate the insulating body 33 (a side wall part 35) to be described later, and are fixed to the insulating body 33, and simultaneously, end parts of the power feed parts 45 and 46 are connected to both ends of the ring shaped part 42R, respectively. The couple of power feed parts 45 and 46 are made of a conductive material such as metal. Through the couple of power feed parts 45 and 46, by applying a current from one end of the ring shaped part 42R to the other end, the ring shaped part 42R is heated to increase the temperature in the process tube 11. The couple of power feed parts 45 and 46 are connected to the controller 280.

The insulating body 33 is installed to surround the outer circumference of the ring shaped part 42R. The insulating body 33 includes the side wall part 35 having a cylindrical shape with open upper and lower ends, and a top wall part 34 configured to cover an upper opening of the side wall part 35, so as to have a cylindrical shape with an open lower end. The insulating body 33 is installed coaxially with each of the outer tube 12 and the ring shaped part 42R. The side wall part 35 and the top wall part 34 is made of an insulating material, for example, such as alumina ($Al_2O_3$) or silica ($SiO_2$) having a fiber shape or a sphere shape. The side wall part 35 and the top wall part 34 each is integrally formed using a method, for example, such as a vacuum foam method. However, the side wall part 35 is not limited to the integrally forming, and thus, may be configured by stacking a plurality of circular insulating materials in a plurality of stages. According to the configuration as described above, when stress is added to the side wall part 35, breakage of the side wall part 35 can be suppressed, or maintenance performance can be improved.

FIG. 5A is a partial enlarged view (plan view) illustrating the ring shaped part 42R viewed from the center side of the ring shaped part 42R (viewed from the process tube 11). Respectively at the upper and lower ends of the ring shaped part 42R, a mountain part (protrusion part) 42a and a valley part (cutout part) 42b are alternately connected in plurality. That is, the ring shaped part 42R has a meander shape (wave shape). At the end (bottom part) of each of the valley parts 42b installed at the upper and lower ends of the ring shaped part 42R, a holding body receiving part 42c, for example, with an elliptical shape being formed as a cutout part is installed. The width of the holding body receiving part 42c (a width along the circumferential direction of the ring shaped part 42R, and also referred to as a first width 'a' hereinafter) is greater than the width of the valley part 42b (a width along the circumferential direction of the ring shaped part 42R, and also referred to as a second width 'b' hereinafter).

The couple of power feed parts 45 and 46 penetrate the insulating body 33 (the side wall part 35) and are fixed to the insulating body 33, and simultaneously, as shown in FIG. 5A and FIG. 5B, through the plurality of holding bodies 41, the respective valley parts 42b are independently fixed to the inner circumferential surface of the insulating body 33 (the side wall part 35), so that the ring shaped part 42R is held to the inner circumferential surface of the insulating body 33. The holding bodies 41 each is configured to be disposed in the holding body receiving part 42c, and fixed to the insulating body 33. The holding body 41 is configured as a pin having a bridge shape (binder (clamp) shape). Both ends of the holding body 41 configured as a pin having a bridge shape are respectively inserted into the holding body receiving parts 42c adjacent to both the ends, from the center side of the ring shaped part 42R to the outside (to the side wall part 35), so that both the ends are stuck and fixed to the inner circumferential surface of the insulating body 33 (the side wall part 35). The outer circumferential surface of the ring shaped part and the inner circumferential surface of the side wall part 35 are held to be spaced a predetermined distance (a width along the radial direction of the ring shaped part 42R, and also referred to as a third width 'c' hereinafter) from each other without contact, and are fixed. The holding body 41 is not limited to the above-described bridge shape, and thus, may be configured as an L-shaped pin with an end being inserted and fixed into the inner circumferential surface of the insulating body 33 (the side wall part 35), or may be configured as a T-shaped pin with the center part being inserted and fixed into the inner circumferential surface of the insulating body 33 (the side wall part 35).

According to the configuration as described above, a greater movement value along the circumferential direction of the ring shaped part 42R than that in the related art is secured. That is, the ring shaped part 42R is fixed, maximally securing a movement value corresponding to the width (the first width 'a') of the holding body receiving part 42c along the circumferential direction of the ring shaped part 42R. In addition, along the radial direction of the ring shaped part 42R, a predetermined movement value is secured. That is, the ring shaped part 42R is fixed, maximally securing a movement value corresponding to the third width 'c' along the radial direction of the ring shaped part 42R.

When being heated, the ring shaped part 42R having a meander shape tends to grow along the circumferential direction or the radial direction by thermal expansion. According to the current embodiment, although the ring shaped part 42R is grown along the circumferential direction by thermal expansion, if a relevant growth amount is less than the above-described movement value (maximally the second width 'b'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

When the growth amount of the ring shaped part 42R is greater than a predetermined amount, and a movement value along the circumferential direction of the ring shaped part 42R is zero, plastic stress is added to each part of the ring shaped part 42R, so that the ring shaped part 42R may be deformed. For example, the ring shaped part 42R may be deformed in the manner where the width (the second width of 'b') of the valley part 42b is decreased. According to the current embodiment, the width (the first width 'a') of the holding body receiving part 42c where the holding body 41 is disposed is greater than the width (the second width 'b') of the valley part 42b. Thus, even when the ring shaped part 42R is deformed to decrease the width (the second width 'b') of the valley part 42b, it is difficult that the holding body 41 and the ring shaped part 42R interfere with (contact) each other, so as to suppress shearing of the holding body 41.

In addition, even when the ring shaped part 42R is grown along the radial direction by thermal expansion, if a relevant growth amount is less than the above-described movement value (maximally the third width 'c'), the contact between the ring shaped part 42R and an inner circumferential wall of the insulating body 33 is suppressed. In addition, since a local temperature increase (abnormal temperature increase) of the ring shaped part 42R or meltdown of the ring shaped part 42R is suppressed, the service life of the ring shaped part 42R or the insulating body 33 can be increased. In addition, a uniform temperature distribution can be achieved in the process chamber 14.

The case 31 is installed in the manner of surrounding the outer circumference of the insulating body 33. For example, the case 31 has a cylindrical shape with a close open end and an open lower end. For example, the case 31 is made of SUS (stainless steels prescribed in the Japanese Industrial Standard). A gap 32 between the outer circumferential surface of the insulating body 33 and the inner circumferential surface of the case 31 functions as a space for cooling air. An exhaust port penetrating the top wall part 34 and a top wall of the case 31 may be provided to forcibly cool the atmosphere between the insulating body 33 and the outer tube 12.

(3) Substrate Processing Process

Next, as an example of substrate processing processes performed by the above-described substrate processing apparatus, a film forming process will now be described. In the following descriptions, the operation of each part of the substrate processing apparatus is controlled by the controller 280.

As shown in FIG. 1, the boat 22 charged with a plurality of wafers 1 (wafer charging) are raised upward and loaded into the process chamber 14 by the boat elevator 21 (boat loading). In this state, the bottom opening of the manifold 16 is sealed with the seal cap 20.

To maintain the inside of the process tube 11 at a predetermined pressure (vacuum degree), a vacuum exhaust operation is performed through the exhaust pipe 17. In addition, to maintain the inside of the process tube 11 at a predetermined temperature, the inside of the process tube 11 is heated by the heater unit 30. That is, through the couple of power feed parts 45 and 46, by applying a current from one end of the ring shaped part 42R to the other end, the ring shaped part 42R having a meander shape is heated to increase the temperature in the process tube 11. At this time, to form a predetermined temperature distribution in the process chamber 14, the power condition of the heating element 42 of the heater unit 30 is feedback controlled based on temperature information detected by the temperature sensor 24. Subsequently, the boat 22 is rotated by the rotary mechanism 25, so as to rotate the wafers 1.

When being heated, the ring shaped part 42R having a meander shape tends to grow along the circumferential direction or the radial direction by thermal expansion. According to the current embodiment, greater movement values along the circumferential and radial directions of the ring shaped part 42R than those in the related art are secured. In addition, although the ring shaped part 42R is grown along the circumferential direction by thermal expansion, if a relevant growth amount is less than the above-described movement value (maximally the second width 'b'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

Thereafter, raw material gas controlled at a predetermined flowrate is introduced into the process chamber 14 through the gas introduction pipe 23. The introduced raw material gas circulates in the process chamber 14, is discharged from the top opening of the inner tube 13 into the exhaust passage 18, and then, is exhausted from the exhaust pipe 17. When the raw material gas passes through the inside of the process chamber 14, the raw material gas is in contact with the surface of the wafer 1, and, at this time, the wafer 1 is processed, so that a thin film is deposited on the surface of the wafer 1, for example, by a thermal CVD reaction.

After a preset process time is elapsed, inert gas is supplied from an inert gas supply source (not shown), and gas in the process chamber 14 is replaced with the inert gas. Simultaneously, the inside of the process chamber 14 returns to a normal pressure.

After that, the seal cap 20 is moved downward by the boat elevator 21 to open the lower end of the manifold 16, and simultaneously, the boat 22 holding the processed wafers 1 is unloaded from the lower end of the manifold 16 to the outside of the process tube 11 (boat unloading). After that, the processed wafers 1 are discharged from the boat 22 (wafer discharging).

(4) Effects Relevant to the Current Embodiment

According to the current embodiment, at least one of effects (a) to (e) is attained as follows.

(a) At the end (the bottom part of the valley part) of each of the valley parts 42b installed at the upper and lower ends of the ring shaped part 42R relevant to the current embodiment, the holding body receiving part 42c formed as a cutout part is installed. The width (the first width 'a') of the holding body receiving part 42c is greater than the width (the second width 'b') of the valley part 42b. The ring shaped part 42R is fixed by the couple of power feed parts 45 and 46 penetrating the side wall of the insulating body 33, and simultaneously, the ring shaped part 42R is held to the inner circumferential surface of the insulating body 33 by the respective valley parts 42b independently fixed to the inner circumferential surface of the insulating body 33 through the holding bodies 41. The holding bodies 41 are configured to be respectively disposed in the holding body receiving parts 42c, and fixed to the insulating body 33.

When being heated, the ring shaped part 42R having a meander shape tends to grow along the circumferential direction by thermal expansion. In addition, when a growth amount of the ring shaped part 42R along the circumferential direction is greater than a predetermined amount, and a movement value is zero, plastic stress is added to each part of the ring shaped part 42R, so that the ring shaped part 42R may be deformed. For example, the ring shaped part 42R may be deformed in the manner where the width (the second width of 'b') of the valley part 42b is decreased. According to the current embodiment, the width (the first width 'a') of the holding body receiving part 42c where the holding body 41 is disposed is greater than the width (the second width 'b') of the valley part 42b. Thus, even when the ring shaped part 42R is deformed to decrease the width (the second width 'b') of the valley part 42b, it is difficult that the holding body 41 and the ring shaped part 42R interfere with (contact) each other, so as to suppress shearing of the holding body 41.

If the holding body 41 is directly disposed in each of the valley parts 42b without installing the holding body receiving part 42c at the end of each of the valley parts 42b, the width (the second width 'b') of the valley part 42b is decreased, and the holding body 41 and the ring shaped part 42R interfere with (contact) each other, so that any one of the holding body 41 and the ring shaped part 42R may be damaged, or the holding body 41 may be fitted into the valley part 42b and sheared.

(b) In addition, according to the configuration as described above, a greater movement value along the circumferential direction of the ring shaped part 42R than that in the related art is secured. That is, a movement value along the circumferential direction of the ring shaped part 42R is secured to maximally reach a size corresponding to the width (the first width 'a') of the holding body receiving part 42c. As a result, even when the ring shaped part 42R is grown along the circumferential direction by thermal expansion, the interference (contact) between the ring shaped part 42R and the holding body 41 is suppressed, so that a case such as missing of the holding body 41 is suppressed. In addition, since the interference (contact) between the ring shaped part 42R and the holding body 41 is difficult, compressive stress affecting the ring shaped part 42R is reduced to suppress deformation, a crack or a short circuit of the ring shaped part 42R.

Figure 17A:
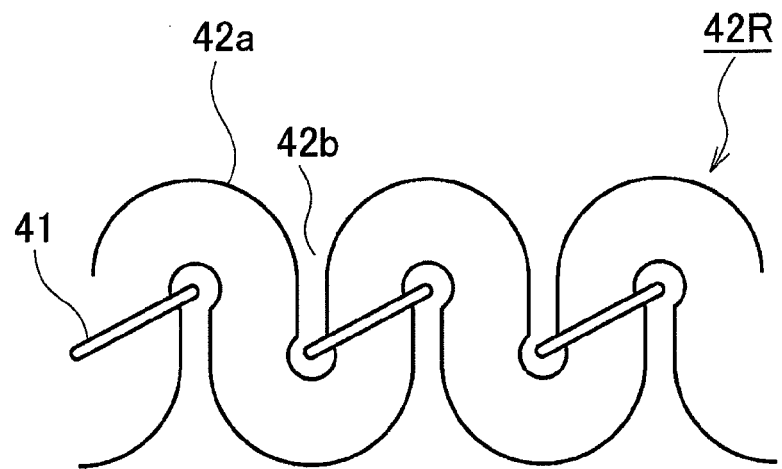
FIG. 17A and FIG. 17B are schematic views illustrating thermal deformation states of a heating element according to the first embodiment of the present invention, FIG. 17A illustrating a state before temperature is increased, FIG. 17B illustrating a state after temperature is increased.
Figure 17B:
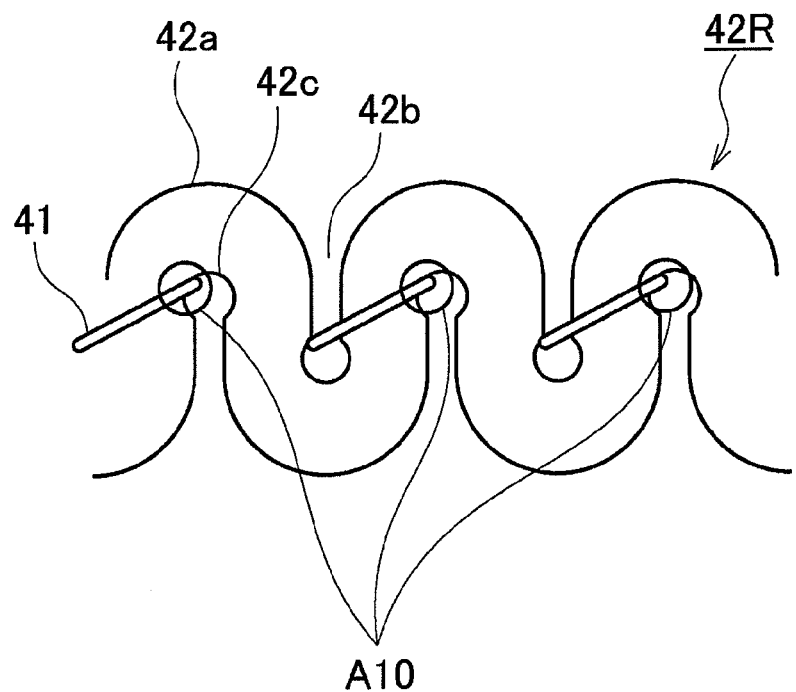

FIG. 17A and FIG. 17B are schematic views illustrating a thermal deformation state of a heating element according to the first embodiment of the present invention.

FIG. 17A is a schematic view illustrating thermal deformation of the heating element before temperature is increased, and FIG. 17B is a schematic view illustrating thermal deformation of the heating element after temperature is increased. Referring to FIG. 17A and FIG. 17B, as shown in regions A10, the holding body receiving parts 42c configured as cutout parts having a large width are provided to secure a great movement value along the circumferential direction of the ring shaped part 42R, and thus, the interference (contact) between the ring shaped part 42R and the holding body 41 is suppressed, so that a case such as missing of the holding body 41 is suppressed. In addition, compressive stress affecting the ring shaped part 42R is reduced to suppress deformation, a crack or a short circuit of the ring shaped part 42R. As described above, even when the ring shaped part 42R is deformed, by disposing the holding body 41 in the holding body receiving part 42c, it is difficult that the holding body 41 is fitted into the valley part 42b, so that breakage or shearing of the holding body 41 is suppressed.

For reference, thermal deformation of a heating element without the holding body receiving part 42c will now be described with reference to FIG. 16.

Figure 16A:
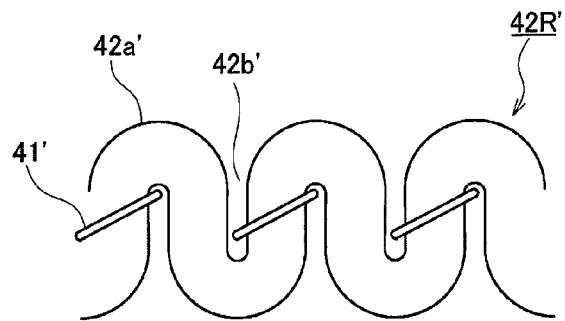
FIG. 16A, FIG. 16B, FIG. 16C, and FIG. 16D are partial enlarged views illustrating temperature deformation states of a ring shaped part without a holding body receiving part, FIG. 16A illustrating a state before temperature is increased, FIG. 16B illustrating a state after temperature is increased, FIG. 16C illustrating a state where shearing of a holding body, a split of the ring shaped part, and a short circuit of the ring shaped part are caused by thermal deformation, FIG. 16D illustrating a state where missing of the holding body is caused by thermal deformation.
Figure 16B:
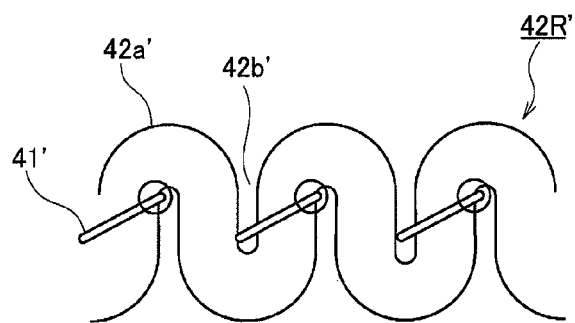

FIG. 16A is a schematic view illustrating a ring shaped part 42R' without the holding body receiving part 42c before temperature is increased. Respectively at the upper and lower ends of the ring shaped part 42R', a mountain part 42a' and a valley part 42b' are alternately connected in plurality, in which the ring shaped part 42R' has a meander shape (wave shape). The respective valley parts 42b' are independently fixed to an inner circumferential side wall of an insulating body (not shown) by holding bodies 41', so that the ring shaped part 42R' is held to the inner circumferential side of the insulating body. The holding bodies 41' are directly disposed in the valley parts 42b'. FIG. 16B is a schematic view illustrating the ring shaped part 42R' after temperature is increased. As described above, the ring shaped part 42R' having a meander shape is grown along the circumferential direction by thermal expansion. FIG. 16B is a schematic view illustrating a state where a growth amount along the circumferential direction of the ring shaped part 42R' is greater than a predetermined amount, so that a movement value along the circumferential direction of the ring shaped part 42R' is zero (the holding body 41' interferes with the ring shaped part 42R').

Figure 16C:
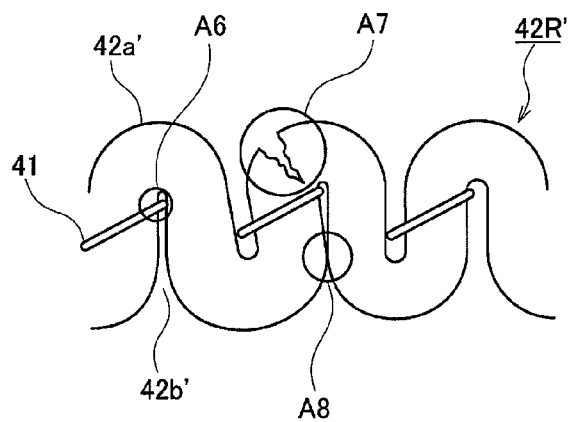
Figure 16D:
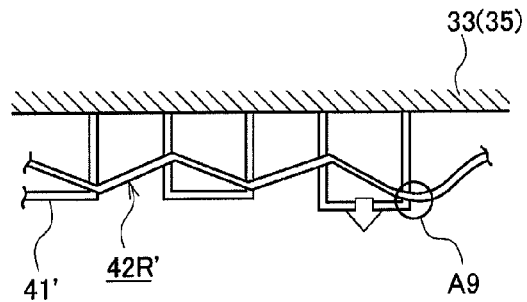

The ring shaped part 42R' is further grown to be in the state shown in FIG. 16c. FIG. 16C is a schematic view illustrating a state where shearing of the holding body 41', a split of the ring shaped part 42R', and a short circuit of the ring shaped part 42R' are caused by thermal deformation. As described above, when a growth amount along the circumferential direction is greater than a predetermined amount, the holding body 41' interferes with the ring shaped part 42R', and plastic stress is added to the ring shaped part 42R', so that the ring shaped part 42R' is deformed. In a region A6, the holding body 41' is fitted into both sides of the valley part 42b' and sheared. In a region A7, the ring shaped part 42R' is split. In a region A8, a short circuit occurs at the ring shaped part 42R'. FIG. 16D is a side view illustrating the ring shaped part 42R' shown in FIG. 16C, and missing of the holding body 41' due to thermal deformation. In a region A9, due to the deformation of the ring shaped part 42R', the holding body 41' is pulled from the insulating body just before removal.

(c) According to the current embodiment, the outer circumferential surface of the ring shaped part 42R and the inner circumferential surface of the side wall part 35 are spaced a predetermined distance (the third width 'c') from each other without contact, and are fixed, as shown in FIG. 5B.

According to the configuration as described above, a movement value having a predetermined size along the radial direction of the ring shaped part 42R is secured. That is, the ring shaped part 42R is fixed in the state where a movement value corresponding maximally to the third width 'c' along the radial direction of the ring shaped part 42R is secured. As a result, even when the ring shaped part 42R is grown along the radial direction by thermal expansion, if a relevant growth amount is less than the above-described movement value (maximally the third width 'c'), the contact between the ring shaped part 42R and the inner circumferential wall of the insulating body 33 is suppressed. In addition, since a local temperature increase (abnormal temperature increase) of the ring shaped part 42R or meltdown of the ring shaped part 42R can be suppressed, the service life of the ring shaped part 42R or the insulating body 33 can be increased. In addition, a uniform temperature distribution can be achieved in the process chamber 14.

(d) According to the current embodiment, by increasing the width of the end (the bottom part of the valley) of each of the valley parts 42b installed at the upper and lower ends of the ring shaped part 42R, the holding body receiving part 42c is formed, so that at least one of the above-described effects can be attained. That is, without significantly reducing the surface area (heating area) of the ring shaped part 42R (without degrading the heating performance of the heater unit 30), at least one of the above-described effects can be attained.

(e) According to the current embodiment, by increasing the width of the end (the bottom part of the valley) of each of the valley parts 42b, the holding body receiving part 42c is formed, so that dispersion in a current density can be achieved at the end (the bottom part of the valley) of each of the valley parts 42b, thus increasing the service life of the ring shaped part 42R. In addition, since a temperature difference in the ring shaped part 42R is decreased, the temperature uniformity of a substrate when processing the substrate can be improved.

Figure 19:
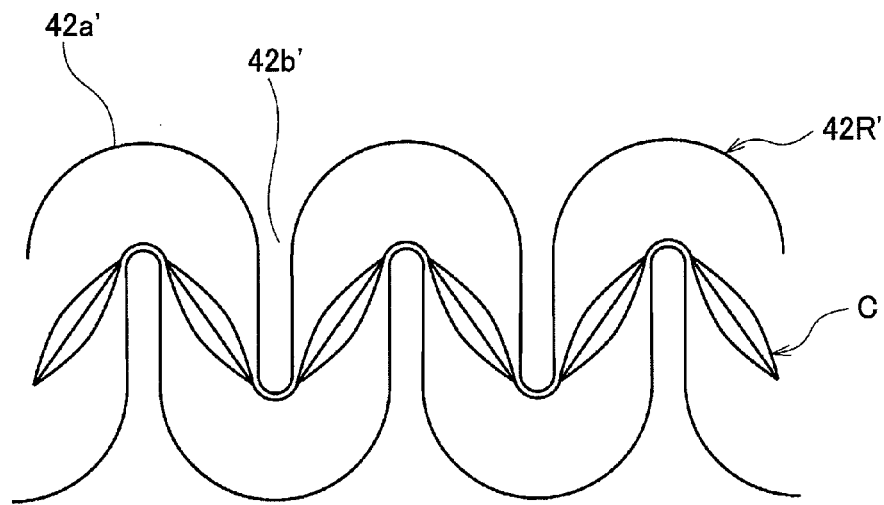
FIG. 19 is a schematic view illustrating a current path in a ring shaped part without a holding body receiving part.
Figure 20:
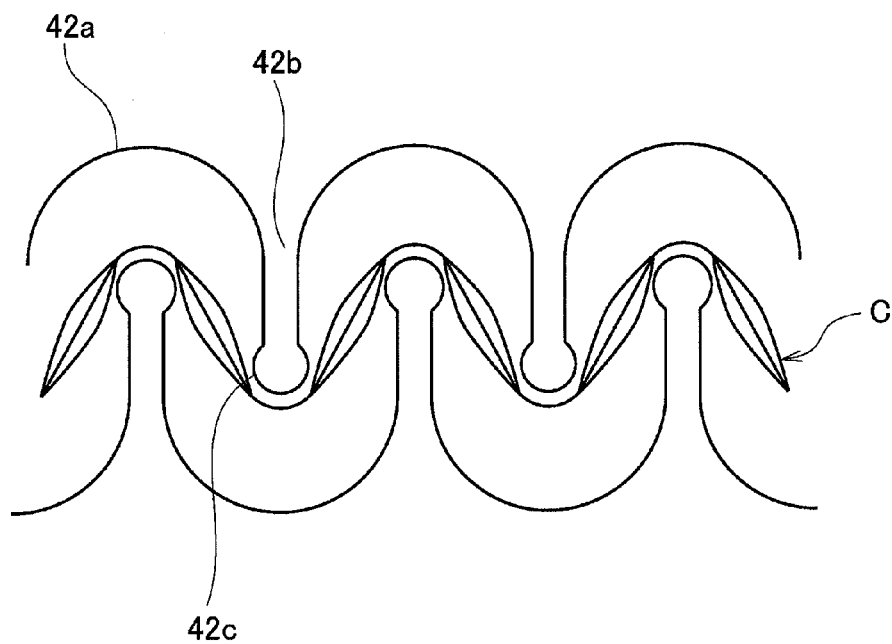
FIG. 20 is a schematic view illustrating a current path in a heating element according to the first embodiment of the present invention.

FIG. 19 is a schematic view illustrating a current path C in the ring shaped part 42R' without a holding body receiving part, and FIG. 20 is a schematic view illustrating a current path C in the ring shaped part 42R according to the first embodiment of the present invention.

As shown in FIG. 19, at the end of the valley part 42b' (at the bottom part of the valley), an electric current flows in a quick curve shape. That is, at the end of the valley part 42b' (at the bottom part of the valley), a current density is increased, and the amount of heat is increased comparing to the other portions except for the end, so that local temperature increase can easily occur. If a temperature difference in the ring shaped part 42R' is increased, plastic stress is added to the ring shaped part 42R' by the difference in thermal expansion amounts, so that the ring shaped part 42R' may be deformed and broken.

As shown in FIG. 20, the holding body receiving part 42c having a large diameter is installed at the end of the valley part 42b (at the bottom part of the valley), and an electric current flows in a relatively gentle curve shape at the end of the valley part 42b. That is, at the end of the valley part 42b (at the bottom part of the valley), a current density can be decreased comparing to the case of FIG. 19, so that a difference in the amount of heat between the end and the other parts is decreased to suppress a local temperature increase. When a temperature difference in the ring shaped part 42R is decreased, plastic stress affecting the ring shaped part 42R is decreased by the difference in thermal expansion amounts, so that deformation or breakage of the ring shaped part 42R is suppressed. In addition, since a temperature difference in the ring shaped part 42R is decreased, the temperature uniformity of a substrate when processing the substrate can be improved.

Preferably, the holding body receiving part 42c may have an oval shape. According to this configuration, the density can be further dispersed. In addition, the strength of surroundings of the holding body receiving part 42c can be increased. In addition, the area of the heating element 42 can be increased.

(6) Modified Example

Hereinafter, a modified example of the current embodiment will now be described.

Modified Example

The holding body receiving part 42c relevant to the present invention is not limited to an oval shape as in the above-described embodiment, and thus, a circular shape having a greater diameter than the width (the second width 'b') of the valley part 42b (circular shape having a diameter equal to the first width 'a') may be formed as a cutout part. FIG. 6A is a partial enlarged view illustrating the ring shaped part 42R according to the modified example of the first embodiment of the present invention, and FIG. 6B is a side view illustrating an enlarged part of FIG. 6A.

According to the current modified example, a greater movement value along the vertical direction of the ring shaped part 42R than that in the related art is secured. That is, a movement value along the vertical direction of the ring shaped part 42R is secured to maximally reach a size corresponding to the diameter (the first width 'a') of the holding body receiving part 42c. As a result, even when the ring shaped part 42R is misaligned along the vertical direction by thermal expansion, if a relevant deviation amount is less than the above-described movement value (maximally the first width 'a'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

In addition, according to the current modified embodiment, since the holding body receiving part 42c has, as a cutout part, a circular shape having a greater diameter than the width (the second width 'b') of the valley part 42b (circular shape having a diameter equal to the first width 'a'), new dispersion in a current density can be achieved at the end of each of the valley parts 42b (at the bottom part of the valley). That is, an electric current flows in a more gentle curve at the end of each of the valley parts 42b, and deformation or breakage of the ring shaped part 42R is further suppressed to make temperatures conducted to a substrate uniform, so that the temperature uniformity in processing a substrate can be further improved.

Another Modified Example

According to a study of the inventors, when the couple of power feed parts 45 and 46 are fixed to the insulating body 33, a position deviation amount of each portion of the ring shaped part 42R due to thermal expansion is accumulated and increased as it goes away from the couple of power feed parts 45 and 46. In this case, a movement value of the ring shaped part 42R may not be identical along the entire circumference of the ring shaped part 42R, and may be appropriately adjusted according to a position deviation amount or a position variation direction. In the current modified example, instead of making the width (or diameter) of the holding body receiving part 42c identical along the entire circumference of the ring shaped part 42R, the width (or diameter) of the holding body receiving part 42c is locally varied according to a position deviation amount or a position variation direction. For example, the width of the holding body receiving part 42c is set to increase as it goes away from the couple of power feed parts 45 and 46.

Figure 7A:
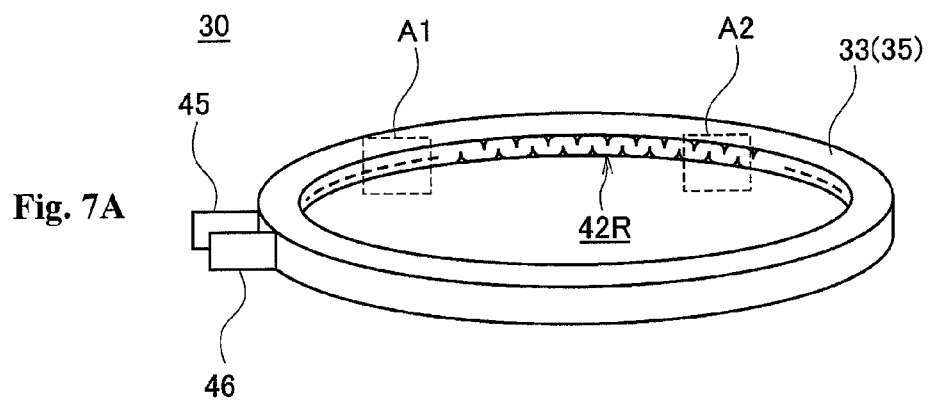
FIG. 7A is a partial enlarged view illustrating the heater unit according to the modified example of the first embodiment of the present invention.
Figure 7B:
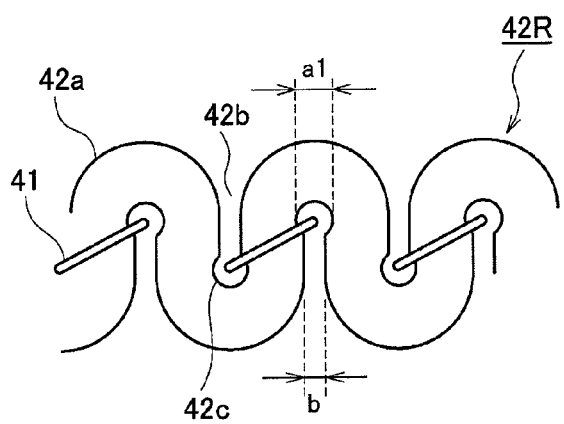
FIG. 7B is a partial enlarged view illustrating a region A1 of the ring shaped part.
Figure 7C:
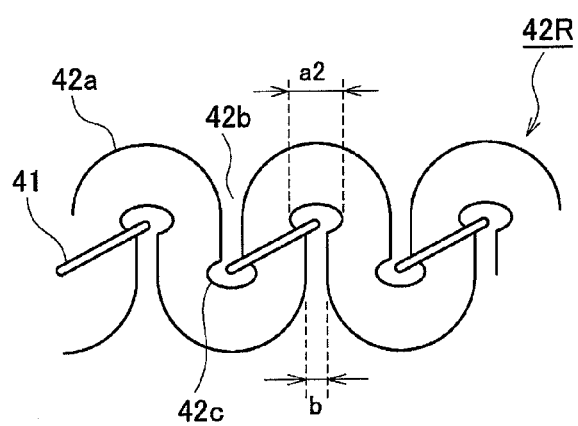
FIG. 7C is a partial enlarged view illustrating a region A2 of the ring shaped part.

FIG. 7A is a partial enlarged view illustrating the heater unit 30 according to the modified example of the first embodiment of the present invention, and FIG. 7B is a partial enlarged view illustrating a region A1 of the ring shaped part 42R of FIG. 7A, and FIG. 7C is a partial enlarged view illustrating a region A2 of the ring shaped part 42R of FIG. 7A. As shown in FIG. 7A, FIG. 7B and FIG. 7C, the width (a first width a2) of the holding body receiving part 42c in a region (for example, the region A2) away from the couple of power feed parts 45 and 46 is set to be greater than the width (a first width a1) of the holding body receiving part 42c in a region (for example, the region A1) close to the couple of power feed parts 45 and 46.

According to the current modified example, a necessary movement value of each part of the ring shaped part 42R is independently secured to suppress the interference (contact) between the ring shaped part 42R and the holding body 41, and an unnecessary movement value of each part of the ring shaped part 42R is independently decreased to improve the stability in holding the ring shaped part 42R. In FIG. 7A, FIG. 7B and FIG. 7C, if the width of the holding body receiving part 42c is set uniformly to the first width a2 along the entire circumference of the ring shaped part 42R, a growth value of the ring shaped part 42R close to the couple of power feed parts 45 and 46 excessively increases, so that holding of the ring shaped part 42R is unstable. In addition, if the width of the holding body receiving part 42c is set uniformly to the first width a1 along the entire circumference of the ring shaped part 42R, a growth value of the ring shaped part 42R away from the couple of power feed parts 45 and 46 excessively decreases, so that interference (contact) between the ring shaped part 42R and the holding body 41 easily occurs, and thus, elastic stress is easily added to the ring shaped part 42R.

In addition, according to the current modified example, the sizes respectively of the holding body receiving parts 42c are set to the bare minimums without unnecessarily decreasing the surface area (heating area) of the ring shaped part 42R, so that the degradation in heating performance of the heater unit 30 can be suppressed.

For reference, thermal deformation of the ring shaped part 42R will now be described with reference to FIG. 21 and FIG. 22.

Figure 21:
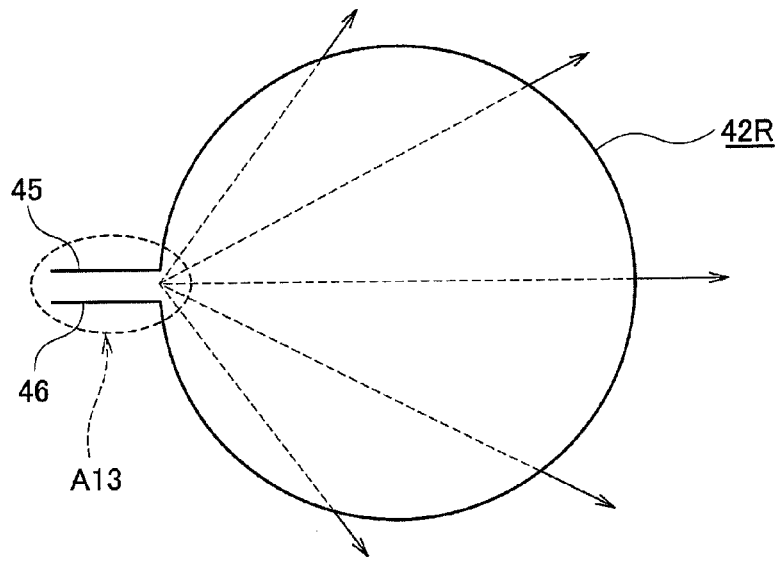
FIG. 21 is a schematic view illustrating expansion directions of a ring shaped part.

FIG. 21 is a schematic view illustrating expansion directions of the ring shaped part 42R. As shown in FIG. 21, since the couple of power feed parts 45 and 46 are fixed to the insulating body 33, each portion of the ring shaped part 42R independently expands not in a concentric circle, but in each arrow direction in the drawing from a region (a region A13) close to the couple of power feed parts 45 and 46, as a base point. Thus, a position deviation amount of each portion of the ring shaped part 42R is accumulated and increased as it goes away from the couple of power feed parts 45 and 46.

Figure 22:
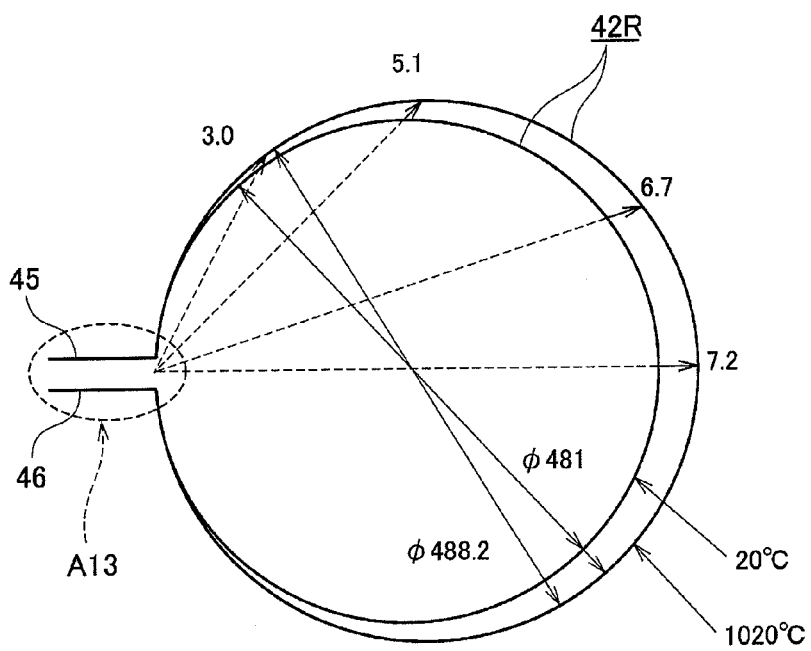
FIG. 22 is a schematic view illustrating the result of measurement relevant to thermal expansion of a ring shaped part.

FIG. 22 is a schematic view illustrating the result of measurement relevant to thermal expansion of the ring shaped part 42R. In the measurement shown in FIG. 22, the ring shaped part 42R was formed using Kanthal APM (registered trade mark), which has a coefficient of linear expansion of $15 \times 10^{-6}$ at a temperature ranging from 20° C. to 1000° C. At a temperature of 20° C., the diameter of the ring shaped part 42R was 481 mm. In the state where a region close to the couple of power feed parts 45 and 46 was fixed, the temperature of the ring shaped part 42R was increased from 20° C. to 1020° C. Diameter growth amount due to the temperature increase=(Length of the ring shaped part 42R)×(1020−20)× $15 \times 10^{-6}$ mm, and the diameter of the ring shaped part 42R was 488.2 mm at a temperature of 1020° C. As shown in FIG. 22, position deviation amounts respectively of portions of the ring shaped part 42R gradually increased as it went away from the couple of power feed parts 45 and 46 (were 3.0 mm, 5.1 mm, and 6.7 mm from the region A13 as a base point), and the farthest portion from the couple of power feed parts 45 and 46 was the maximum (7.2 mm). At the farthest place from the couple of power feed parts 45 and 46, a position deviation along the circumferential direction almost does not occur, and a position deviation along only the radial direction occurs. Thus, at the farthest place from the couple of power feed parts 45 and 46, it may be unnecessary to increase the width of the holding body receiving part 42c as shown in FIG. 7c.

Further another Modified Example

In the current modified example, a relative position between the holding body receiving part 42c and the holding body 41 is set to be varied in at least one portion of the entire circumference of the ring shaped part 42R. That is, instead of locally varying the width of the holding body receiving part 42c, the position of the holding body 41 disposed in the holding body receiving part 42c is adjusted to locally vary a movement value along the circumferential direction of the ring shaped part 42R.

Figure 8A:
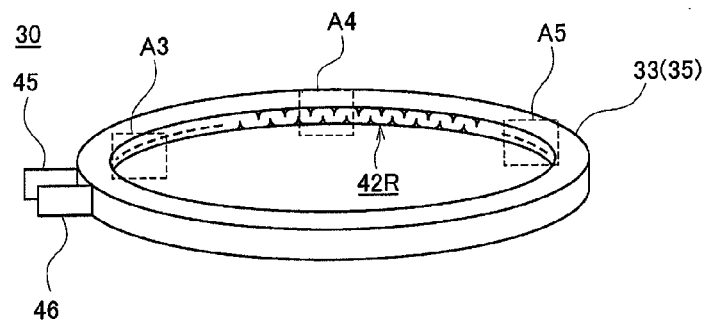
FIG. 8A is a partial enlarged view illustrating the heater unit according to the modified example of the first embodiment of the present invention.
Figure 8B:
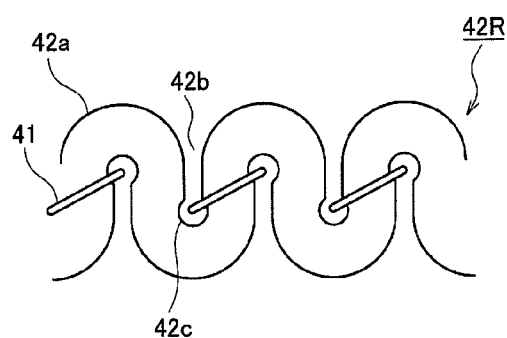
FIG. 8B is a partial enlarged view illustrating a region A3 of the ring shaped part.
Figure 8C:
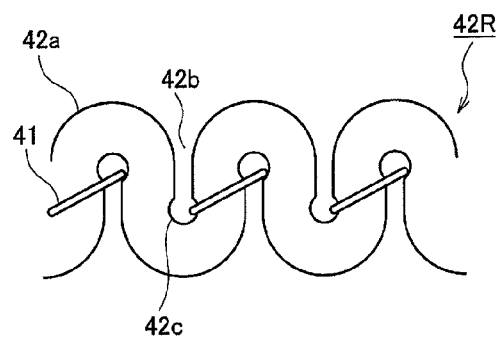
FIG. 8C is a partial enlarged view illustrating a region A4 of the ring shaped part.
Figure 8D:
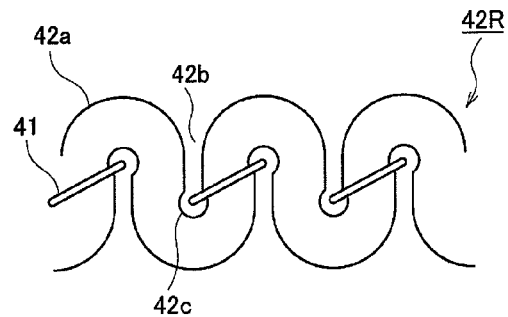
FIG. 8D is a partial enlarged view illustrating a region A5 of the ring shaped part.

FIG. 8A is a partial enlarged view illustrating the heater unit 30 according to the modified example of the first embodiment of the present invention. FIG. 8B is a partial enlarged view illustrating a region A3 of the ring shaped part of FIG. 8A. FIG. 8C is a partial enlarged view illustrating a region A4 of the ring shaped part of FIG. 8A. FIG. 8D is a partial enlarged view illustrating a region A5 of the ring shaped part of FIG. 8A.

As shown in FIG. 8B, since a movement value along the circumferential direction of the ring shaped part 42R is desirably minimized in the region A3 (near the couple of power feed parts 45 and 46), the end of the holding body 41 is disposed at the center of the holding body receiving part 42c. In this case, the movement value along the circumferential direction of the ring shaped part 42R in the region A3 is about half the width (the first width 'a') of the holding body receiving part 42c.

In addition, as shown in FIG. 8C, since a movement value along the circumferential direction of the ring shaped part 42R is necessary at the region A4 (at a place away from the couple of power feed parts 45 and 46), the end of the holding body 41 is disposed not at the center of the holding body receiving part 42c, but at a dislocated position out of the center of the holding body receiving part 42c. By dislocating the end of the holding body 41 to the edge of the holding body receiving part 42c, a movement value along the circumferential direction of the ring shaped part 42R can be secured maximally to the first width 'a').

In addition, as shown in FIG. 8D, since a movement value along the circumferential direction of the ring shaped part 42R is desirably minimized in the region A5, the end of the holding body 41 is disposed at the center of the holding body receiving part 42c. As described above, this is because, at the region A5 (at the farthest place from the couple of power feed parts 45 and 46), a position deviation along the circumferential direction almost does not occur, and a large position deviation along only the radial direction occurs. In this case, the movement value along the circumferential direction of the ring shaped part 42R in the region A5 is about half the width (the first width 'a') of the holding body receiving part 42c as in the case of FIG. 8B.

According to the current modified example, a necessary movement value of each portion of the ring shaped part 42R is independently secured to suppress the interference (contact) between the ring shaped part 42R and the holding body 41, so that plastic stress affecting the ring shaped part 42R can be suppressed. In addition, an unnecessary movement value of each portion of the ring shaped part 42R is reduced to improve the stability in holding the ring shaped part 42R. In addition, since it is desirable that the sizes of the holding body receiving parts 42c are uniform along the entire circumference of the ring shaped part 42R, manufacturing costs of the ring shaped part 42R can be reduced.

Second Embodiment

A second embodiment of the present invention will be described hereinafter with reference to the attached drawings.

Figure 9:
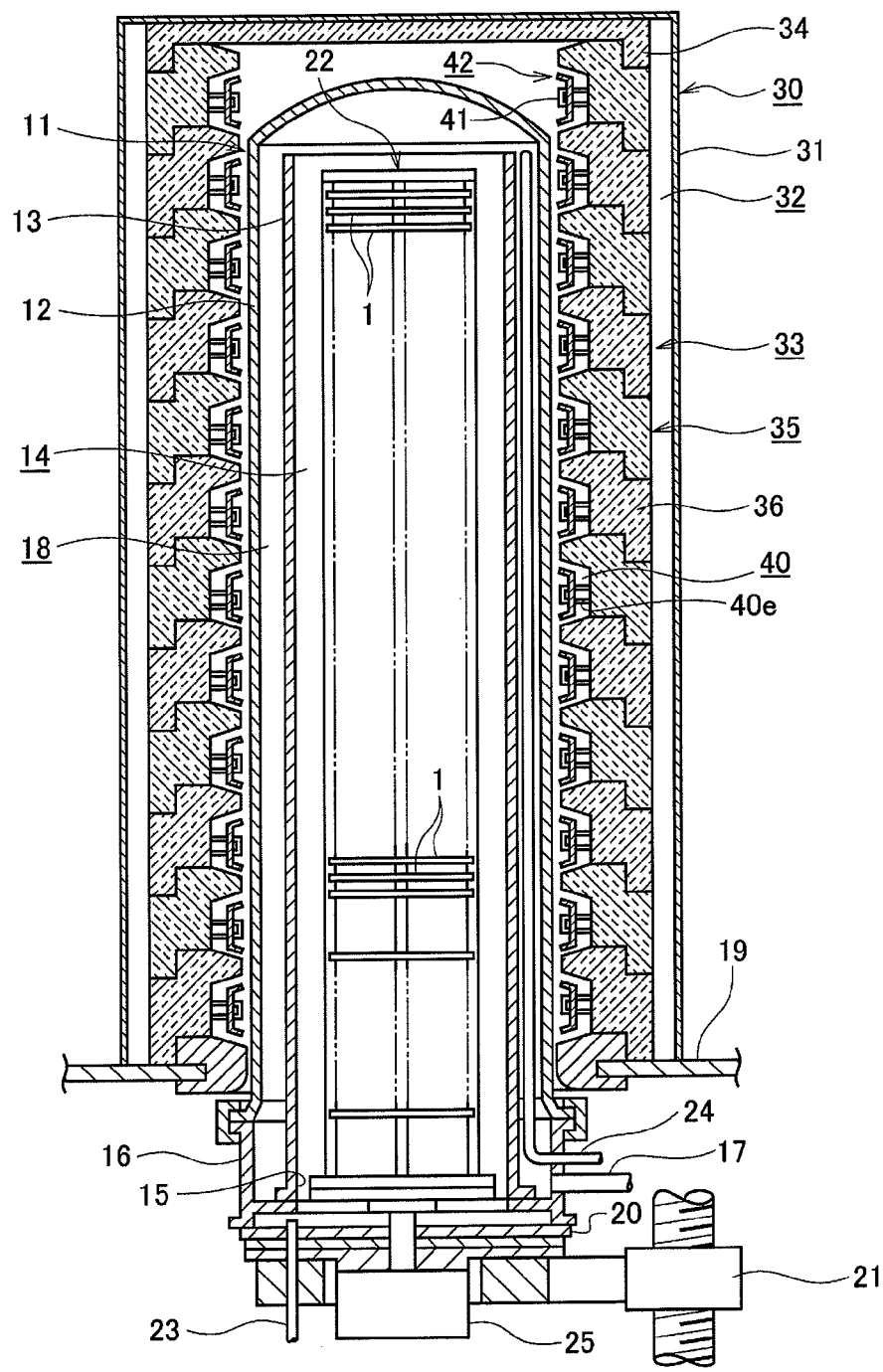
FIG. 9 is a vertical cross-sectional view illustrating a substrate processing apparatus according to a second embodiment of the present invention.
Figure 10:
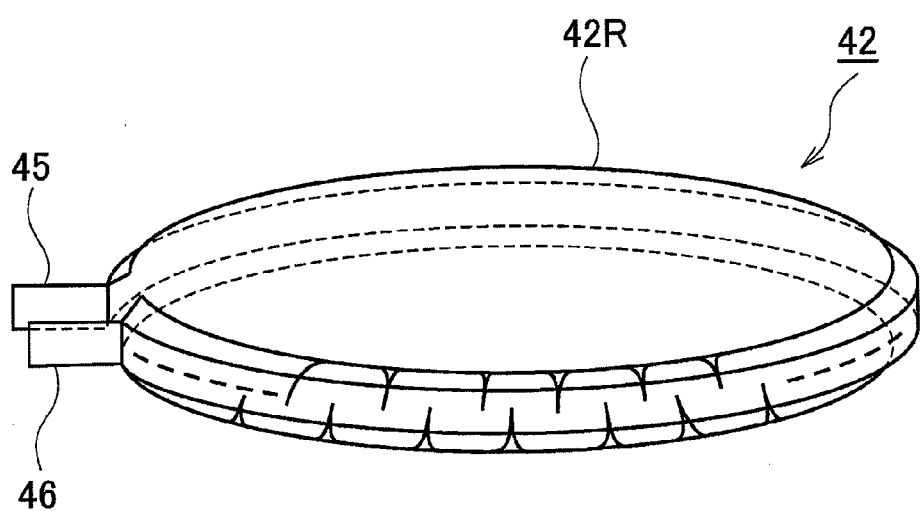
FIG. 10 is a perspective view illustrating a heating element according to the second embodiment of the present invention.
Figure 11B:
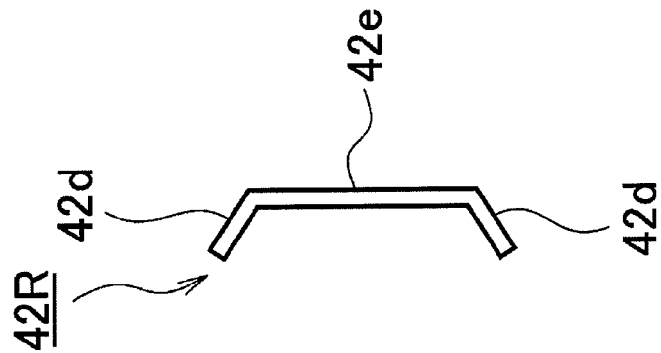
FIG. 11B is a side view illustrating an enlarged part of FIG. 11A.
Figure 11A:
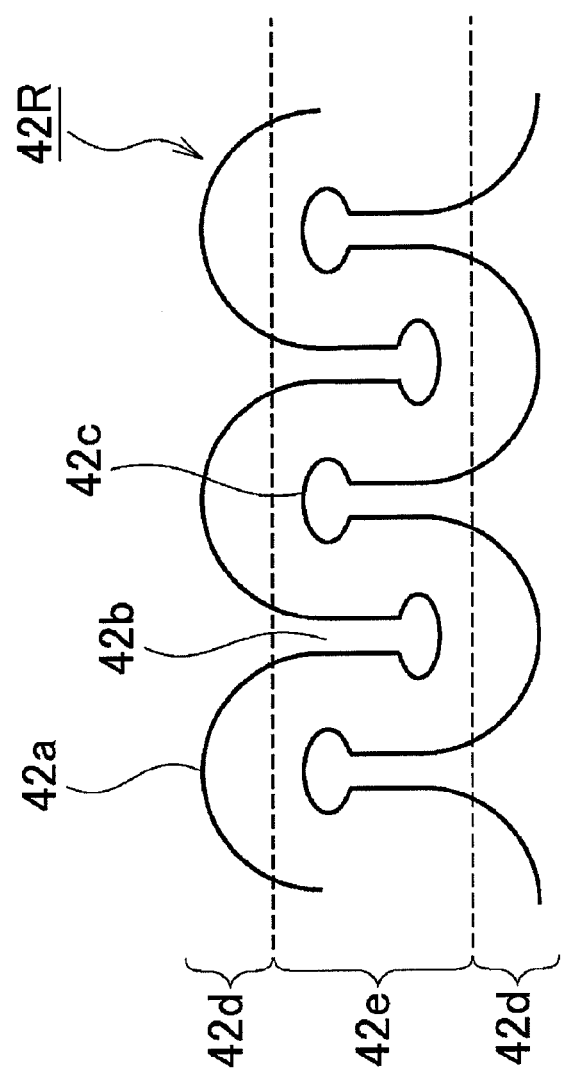
FIG. 11A is a partial enlarged view illustrating a ring shaped part according to the second embodiment of the present invention.
Figure 12A:
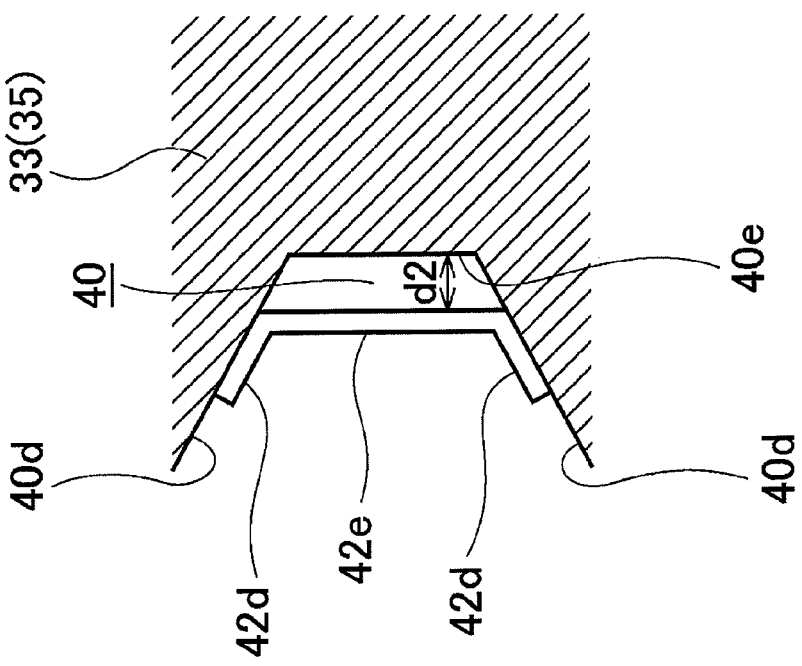
FIG. 12A and FIG. 12B are partial enlarged views illustrating an insulating body holding the ring shaped part according to the second embodiment of the present invention, FIG. 12A illustrating a state before temperature is increased, FIG. 12B illustrating a state after temperature is increased.
Figure 12B:
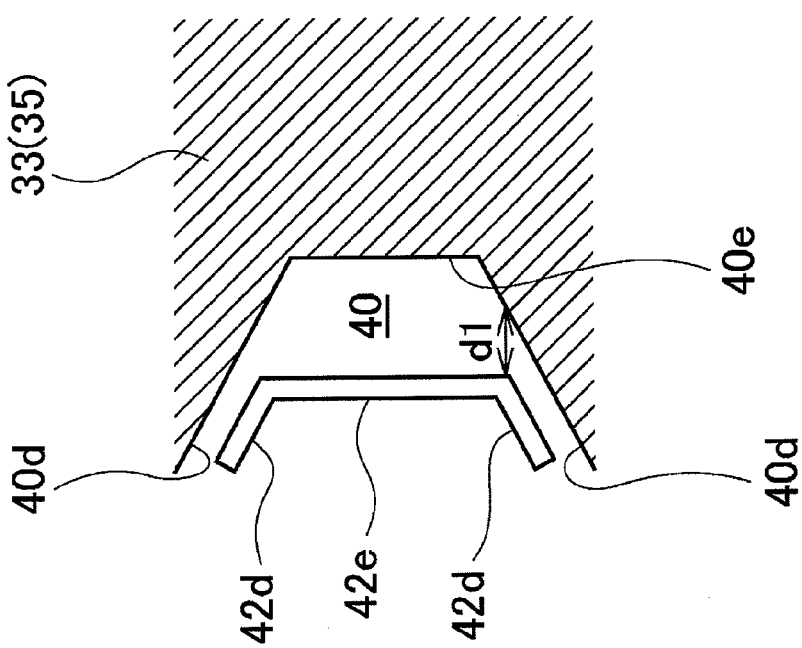

FIG. 9 is a vertical cross-sectional view illustrating a substrate processing apparatus according to the second embodiment of the present invention. FIG. 10 is a perspective view illustrating a heating element according to the second embodiment of the present invention. FIG. 11A is a partial enlarged view illustrating a ring shaped part according to the second embodiment of the present invention, and FIG. 11B is a side view illustrating an enlarged part of FIG. 11A. FIG. 12A and FIG. 12B are partial enlarged views illustrating an insulating body holding the ring shaped part according to the second embodiment of the present invention, FIG. 12A illustrating a state before temperature is increased, FIG. 12B illustrating a state after temperature is increased.

(1) Configurations of Heating Element and Insulating Body

In the substrate processing apparatus relevant to the current embodiment, configurations of the heating element 42 and the insulating body 33 are different from those of the above-described embodiment. The other configurations are the same as those of the above-described embodiment.

In the same manner as in the above-described embodiment, the heating element 42 relevant to the current embodiment includes the ring shaped part 42R formed at a place where the mountain part 42a and the valley part 42b are alternately connected in plurality, and the couple of power feed parts 45 and 46 penetrating the insulating body 33 and fixed to the insulating body 33 and respectively connected to both ends of the ring shaped part 42R. The ring shaped part 42R relevant to the current embodiment is different from that of the above-described embodiment in that, as shown in FIG. 10 and FIG. 11, to direct front ends 42d of the mountain parts 42a of the ring shaped part 42R to the center of the ring shaped part 42R, the front ends 42d are respectively inclined at obtuse angles from a middle part 42e except for the front ends 42d of the mountain parts 42a of the ring shaped part 42R.

The insulating body 33 relevant to the current embodiment, in the same manner as in the above-described embodiment, has a tube shape in the manner of surrounding the outer circumferential surface of the ring shaped part 42R. The insulating body 33 relevant to the current embodiment is different from that of the above-described embodiment in that, as shown in FIG. 9, FIG. 12A, and FIG. 12B, a storage part 40 having a groove shape accommodating the ring shaped part 42R is installed in the inner circumferential surface of the insulating body 33. The storage part 40 having a groove shape is provided in plurality, and the storage parts 40 are vertically arrayed to respectively correspond to the ring shaped parts 42R.

The inner diameter (horizontal diameter) of a bottom surface 40e of the storage part 40 is configured to be greater than the outer shape (horizontal diameter) of the ring shaped part 42R. The vertical width of an opening part of the storage part 40 is configured to be greater than the vertical width of the ring shaped part 42R including the mountain part 42a. The vertical width of the bottom surface 40e of the storage part 40 is configured to be less than the vertical width of the middle part 42e except for the front ends of the mountain part 42a of the ring shaped part 42R. Both side walls (a couple of side walls on upper and lower sides) 40d of the storage part 40 are respectively inclined at obtuse angles from the bottom surface 40e of the storage part 40 having a groove shape. That is, the storage part 40 has a shape that gradually decreases in its vertical width as it goes outward along the radial direction of the insulating body 33 having a cylindrical shape (in the opposite direction to the centripetal direction of the cylindrical shape) (as it comes closer to the bottom surface 40e). In other words, both the side walls 40d of the storage part 40 are formed as tapered surfaces, and the distance between both the side walls 40d decreases as it comes closer to the bottom surface 40e.

The side wall parts 35 of the holding bodies 33 are configured by vertically stacking a plurality of insulating blocks 36 having, for example, doughnut shapes. The insulating blocks 36 and the top wall part 34 is made of an insulating material, for example, such as alumina ($Al_2O_3$) or silica ($SiO_2$) having a fiber shape or a sphere shape. The insulating block 36 is integrally formed using a method, for example, such as a vacuum foam method. As such, since the side wall part 35 of the insulating body 33 is configured by the plurality of insulating blocks 36, the formation of the storage parts 40 having a groove shape or the assembly of the heater unit 30 is facilitated, and simultaneously, the breakage of the side wall part 35 (the insulating blocks 36) when stress is added to the side wall part 35 can be suppressed. In addition, a part of the heating bodies 42 or a part of the insulating blocks 36 stacked in multi stages is conveniently taken out for exchanging or maintenance. However, the side wall part 35 is not limited to the above configuration, and thus, may be integrally formed. In addition, the insulating blocks 36 are not limited to the integrally formation, and thus, may be configured by a plurality of insulating materials having doughnut shapes.

Inclination angles of the front ends 42d of the mountain part 42a of the ring shaped part 42R are set to be identical to inclination angles of both the side walls 40d of the storage part 40. That is, the front ends 42d of the mountain part 42a are approximately parallel to both the side walls 40d of the storage part 40. In addition, as shown in FIG. 12A, when the ring shaped part 42R is in a state before temperature is increased (at least in a room temperature state), the front ends 42d of the mountain part 42a are maintained to be spaced a predetermined distance d1 from the side walls 40d of the storage part 40 without contact. In addition, as shown in FIG. 12B, when the temperature of the ring shaped part 42R is increased, and the ring shaped part 42R grows along the radial direction, the front ends 42d of the mountain part 42a are in surface contact with the side walls 40d of the storage part 40, respectively. At this time, the middle part 42e except for the front ends of the mountain parts 42a of the ring shaped part 42R are maintained to be spaced a predetermined distance d2 from the bottom surface 40e of the storage part 40 without contact.

(2) Effects Relevant to the Current Embodiment

According to the current embodiment, one or more effects are attained as follows.

(a) According to the current embodiment, the inclination angles of the front ends 42d of the mountain parts 42a of the ring shaped part 42R are set to be identical to the inclination angles of the side walls 40d of the storage part 40. That is, the front ends 42d of the mountain parts 42a are approximately parallel to both the side walls 40d of the storage part 40. In addition, when the temperature of the ring shaped part 42R is increased, and the ring shaped part 42R grows along the radial direction, the front ends 42d of the mountain parts 42a are in surface contact with the side walls 40d of the storage part 40, respectively. As a result, adding of compressive stress to the ring shaped part 42R is difficult to suppress deformation of the ring shaped part 42R.

(b) According to the current embodiment, when the temperature of the ring shaped part 42R is increased, and the ring shaped part 42R grows along the radial direction, the middle part 42e except for the front ends of the mountain parts 42a of the ring shaped part 42R are maintained to be spaced the predetermined distance d2 from the bottom surface 40e of the storage part 40 without contact. In addition, a local temperature increase (abnormal temperature increase) of the ring shaped part 42R or meltdown of the ring shaped part 42R due to contact of the ring shaped part 42R with the insulating body 33 can be prevented, and the service life of the ring shaped part 42R or the insulating body 33 can be increased. In addition, a uniform temperature distribution can be achieved in the process chamber 14.

(3) Modified Example

In the above-described embodiment, the vertical width of the bottom surface 40e of the storage part 40 is less than the vertical width of the middle part 42e except for the front ends of the mountain part 42a of the ring shaped part 42R, but the present invention is not limited thereto. For example, the vertical width of the bottom surface 40e of the storage part 40 may be greater than the vertical width of the middle part 42e except for the front ends of the mountain part 42a of the ring shaped part 42R to provide the bottom surface 40e of the storage part 40 with a stepped part having a width less than the vertical width of the middle part 42e.

FIG. 13A and FIG. 13B are schematic views illustrating a modified example of the storage part according to the second embodiment of the present invention, FIG. 13A being a partial enlarged view illustrating the storage part configured to accommodate the ring shaped part, FIG. 13B being a side view illustrating an enlarged part of FIG. 13A. As shown in FIG. 13A and FIG. 13B, a vertical width E2 of the bottom surface 40e of the storage part 40 is set to be greater than a vertical width E1 of the middle part 42e except for the front ends of the mountain part 42a of the ring shaped part 42R. In addition, in the bottom surface 40e of the storage part 40, a stepped part 40f having a width less than the vertical width E1 of the middle part 42e is installed.

According to the current modified example, even when the temperature of the ring shaped part 42R is increased, the ring shaped part 42R grows along the radial direction, and the distance d2 between the middle part 42e except for the front ends of the mountain part 42a of the ring shaped part 42R and the bottom surface 40e of the storage part 40 is zero, the middle part 42e contacts only the stepped part 40f so as to decrease the contact area between the middle part 42e and the bottom surface 40e. As a result, a local temperature increase (abnormal temperature increase) of the middle part 42e or melt of the middle part 42e can be prevented. Specifically, by bringing the stepped part 40f to contact with a region of the middle part 42e having low current density, a local temperature increase (abnormal temperature increase) of the middle part 42e can be prevented more effectively.

Third Embodiment

A third embodiment of the present invention will be described hereinafter with reference to the attached drawings.

Figure 14:
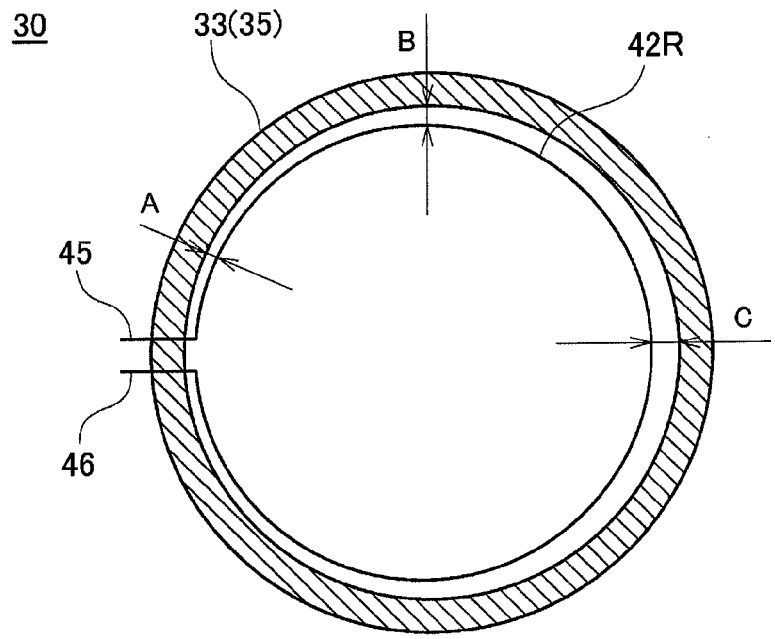
FIG. 14 is a horizontal cross-sectional view illustrating the heater unit before temperature is increased, according to a third embodiment of the present invention.
Figure 15:
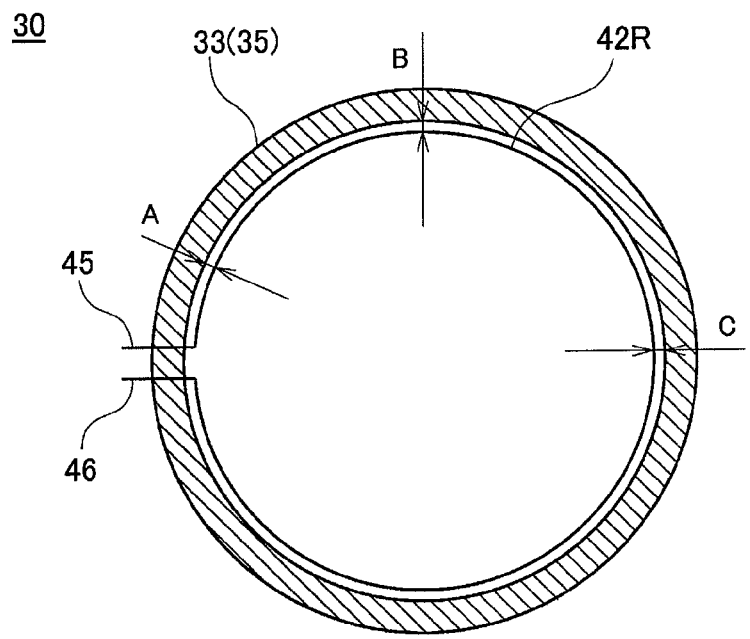
FIG. 15 is a horizontal cross-sectional view illustrating the heater unit after temperature is increased, according to the third embodiment of the present invention.

FIG. 14 is a horizontal cross-sectional view illustrating the heater unit 30 before temperature is increased, according to the third embodiment of the present invention. FIG. 15 is a horizontal cross-sectional view illustrating the heater unit 30 after temperature is increased, according to the third embodiment of the present invention.

In a substrate processing apparatus relevant to the current embodiment, as shown in FIG. 14, the distance between the bottom surface 40e and the middle part 42e is set to increase as it goes away from the couple of power feed parts 45 and 46 at least when the ring shaped part 42R is at a room temperature (that is, at a room temperature, distances A, B, and C of FIG. 14 are set as A<B<C). In addition, as shown in FIG. 15, the distance between the bottom surface 40e and the middle part 42e is set to be identical along the entire circumferences of the storage part 40 and the ring shaped part 42R by thermal expansion at least when the ring shaped part 42R is at a substrate process temperature (that is, at a substrate process temperature, distances A, B, and C of FIG. 15 are set as A≈B≈C).

When temperature is increased, the ring shaped part 42R of the heating element 42 is thermally expanded or is extended along the radial direction and the circumferential direction. In addition, when, due to the extension along the radial direction of the ring shaped part 42R, the distance between the bottom surface 40e and the middle part 42e is uneven along the entire circumference of the ring shaped part 42R, uniformity in temperature distribution of the ring shaped part 42R may be degraded along the circumferential direction. That is, the temperature of the ring shaped part 42R may abnormally increase at a place where the bottom surface 40e is close to the middle part 42e, or the temperature of the ring shaped part 42R may decrease at a place where the bottom surface 40e is close to the middle part 42e. On the other hand, according to the current embodiment, when the ring shaped part 42R is at a substrate process temperature, the distances between the storage part 40 and the ring shaped part 42R are identical along the entire circumferences of the storage part 40 and the ring shaped part 42R by thermal expansion, so that the ring shaped part 42R can be uniformly heated along the circumferential direction of the ring shaped part 42R.

For reference, thermal deformation of the ring shaped part 42R will now be described with reference to FIG. 18 and FIG. 18B.

Figure 18A:
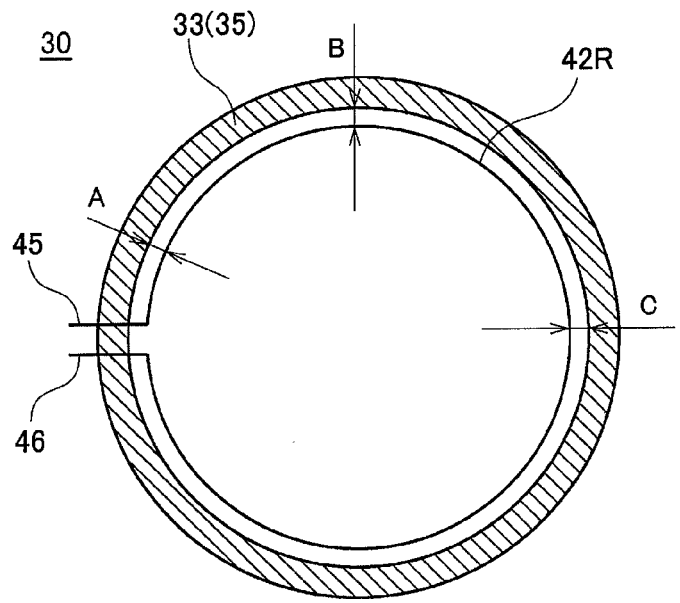
FIG. 18A and FIG. 18B are schematic views illustrating a thermal deformation state of a ring shaped part in the case where a storage part and the ring shaped part have concentric circle shapes at a room temperature, FIG. 18A illustrating a state before temperature is increased, FIG. 18B illustrating a state after temperature is increased.
Figure 18B:
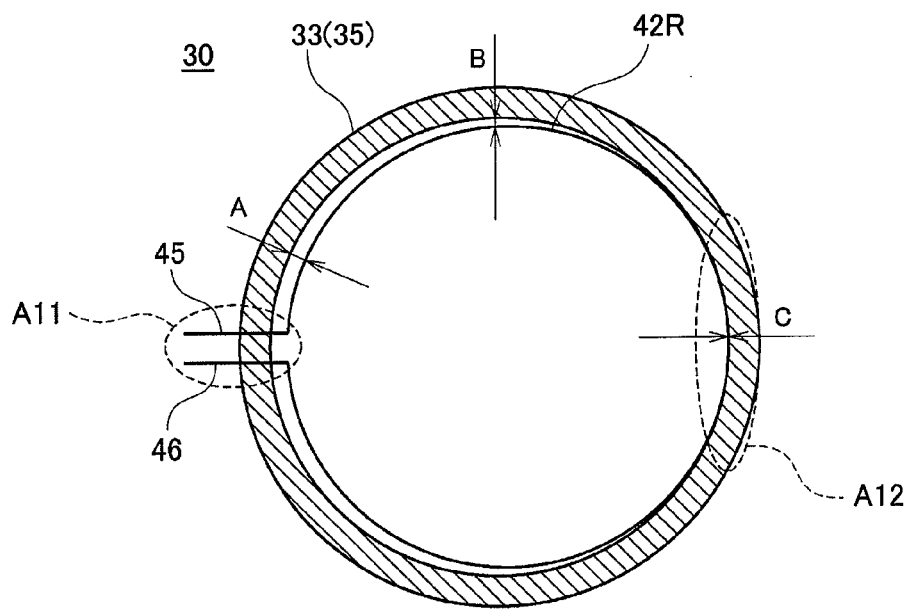

FIG. 18A and FIG. 18B are schematic views illustrating thermal deformation states of the ring shaped part 42R in the case where the storage part 40 and the ring shaped part 42R have concentric circle shapes at a room temperature, FIG. 18A illustrating a state before temperature is increased, FIG. 18B illustrating a state after temperature is increased. As shown in FIG. 18A, before temperature is increased, the distance between the bottom surface 40e and the middle part 42e is uniform along the entire circumference of the ring shaped part 42R. However, as shown in FIG. 18B, when the temperature of the ring shaped part 42R is increased to be a substrate process temperature, the ring shaped part 42R is extended along the diameter of the ring shaped part 42R, and the distances between the bottom surface 40e of the storage part 40 and the middle part 42e except for the front ends of the mountain part 42a of the ring shaped part 42R adjacent to the bottom surface 40e are uneven along the entire circumference of the ring shaped part 42R (distances A, B, and C of FIG. 18B are in a state of A>B>C). That is, since the couple of power feed parts 45 and 46 are fixed to the insulating body 33, each portion of the ring shaped part 42R expands from a region (a region A11) close to the couple of power feed parts 45 and 46, as a base point. In addition, the distance between the bottom surface 40e and the middle part 42e gradually decreases as it goes away from the couple of power feed parts 45 and 46, and the distance between the bottom surface 40e and the middle part 42e is minimum (zero in the current case) in a region (a region A12) farthest from the couple of power feed parts 45 and 46. As a result, a local temperature increase (abnormal temperature increase) of the ring shaped part 42R occurs to melt down the ring shaped part 42R. In addition, uniformity in temperature distribution of the ring shaped part 42R is degraded along the circumferential direction.

Other Embodiments of the Present Invention

The third embodiment of the present invention is not limited to the case where the holding body receiving part 42c formed as a cutout part at the end of the valley part 42b is installed as in the above-described embodiments. That is, as shown in FIG. 19, the present invention is very suitably applicable even to the case where the holding body receiving part 42c is not installed in the heating device including the heating element that has the ring shaped part 42R' formed at a place where the mountain part 42a' and the valley part 42b' are alternately connected in plurality, and that has the couple of power feed parts 45 and 46 penetrating the insulating body 33 and fixed to the insulating body 33 and respectively connected to both ends of the ring shaped part 42R'. In addition, the present invention is very suitably applicable even to the case where a heating element has a ring shaped part without the mountain part 42a' and the valley part 42b' being alternately connected in plurality, for example, a ring shaped part having a coil shape, and the couple of power feed parts penetrating the insulating body and fixed to the insulating body and respectively connected to both ends of the ring shaped part.

The present invention is not limited to a semiconductor manufacturing apparatus, and thus, may be very suitably applicable even to an apparatus configured to process a glass substrate such as a liquid crystal display (LCD) device. In addition, the configuration of the process chamber is not limited to the above-described embodiments. That is, regardless of a detailed description of a substrate process, the substrate process may be any process such as an anneal process, an oxidization process, a nitridation process, and a diffusion process as well as a film forming process. In addition, for example, a film forming process may be a chemical vapor deposition (CVD) process, a physical vapor deposition (PVD) process, an oxide film forming process, a nitride film forming process, or a metal-containing film forming process. In addition, the substrate process may be an exposure process performed using photolithography, or a resist liquid application process or etching liquid application process.

The heating device, the substrate processing apparatus, and the method of manufacturing a semiconductor device according to the present invention can suppress the differences between the heating bodies, and simultaneously, can suppress shearing of the holder due to thermal deformation of the heating bodies.

While the embodiments of the present invention have been particularly described, various changes in form and details may be made without departing from the spirit and scope of the present invention.

Preferred Embodiments of the Present Invention

The present invention also includes the following embodiments.

(Supplementary Note 1)

According to a preferred embodiment of the present invention, there is provided a heating device comprising:

a heating element including a mountain part and a valley part that are alternately connected in plurality in a meander shape with both ends being fixed;

holding body receiving parts respectively installed at ends of the valley parts and formed as cutout parts having a width larger than a width of the valley part;

an insulating body installed at an outer circumference of the heating element; and a holding body disposed in the holding body receiving part and fixed to the insulating body.

Preferably, the holding body receiving part may be formed as a cutout part having a circular shape with a diameter larger than a width of the valley part.

Preferably, the heating element may comprise:

a ring shaped part formed at a place where the mountain part and the valley part are alternately connected in plurality; and a couple of power feed parts penetrating the insulating body and fixed to the insulating body and respectively connected to both ends of the ring shaped part, wherein a width of the holding body receiving part may be set to increase as the holding body receiving part goes away from the power feed parts.

Preferably, the heating element may comprise:

a ring shaped part formed at a place where the mountain part and the valley part are alternately connected in plurality; and a couple of power feed parts penetrating the insulating body and fixed to the insulating body and respectively connected to both ends of the ring shaped part, wherein a relative position between the holding body receiving part and the holding body may be set to be varied in at least one portion of parts respectively constituting an entire circumference of the ring shaped part.

(Supplementary Note 2)

In the heating device of Supplementary Note 1, the heating element may comprise a ring shaped part formed at a place where the mountain part and the valley part are alternately connected in plurality, and a couple of power feed parts penetrating the insulating body and fixed to the insulating body and respectively connected to both ends of the ring shaped part;

the insulating body may comprise a storage part in an inner circumferential surface of the insulating body, and the storage part may have a tube shape in a manner of surrounding an outer circumferential surface of the ring shaped part, and may have a groove shape receiving the ring shaped part;

front ends of the mountain parts of the ring shaped part may be inclined respectively at obtuse angles from a middle part except for the front ends of the mountain parts of the ring shaped part such that the front ends of the mountain parts of the ring shaped part are directed to a center of the ring shaped part;

both side walls of the storage part may be inclined respectively at obtuse angles from a bottom surface of the storage part; and the angles at which the front ends of the mountain parts may be inclined and the angles at which both the side walls of the storage part are inclined may be set to be identical.

Preferably, the bottom surface of the storage part may have a width larger than that of the middle part, and the heating device may comprise a stepped part having a width less than that of the middle part, in the bottom surface of the storage part.

(Supplementary Note 3)

In the heating device of Supplementary Note 1, the heating element may comprise a ring shaped part formed at a place where the mountain part and the valley part are alternately connected in plurality, and a couple of power feed parts penetrating the insulating body and fixed to the insulating body and respectively connected to both ends of the ring shaped part;

the insulating body may comprise a storage part in an inner circumferential surface of the insulating body, and the storage part may be formed in a tube shape in a manner of surrounding an outer circumferential surface of the ring shaped part, and may have a groove shape receiving the ring shaped part; and a distance between a bottom surface of the storage part and a middle part except for front ends of the mountain part of the ring shape part adjacent to the bottom surface may be set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

Preferably, the distance may be set to increase as it goes away from the couple of power feed parts.

(Supplementary Note 4)

According to another preferred embodiment of the present invention, there is provided a substrate processing apparatus comprising:

a heating device that comprises a heating element including a mountain part and a valley part that are alternately connected in plurality in a meander shape with both ends being fixed, holding body receiving parts respectively installed at ends of the valley parts and formed as cutout parts having a width larger than a width of the valley part, an insulating body installed at an outer circumference of the heating element, and a holding body disposed in the holding body receiving part and fixed to the insulating body; and a process chamber installed in the heating device and processing a substrate.

Preferably, the holding body receiving part may be formed as a cutout part having a circular shape with a diameter larger than the width of the valley part.

Preferably, the heating element may comprise:

a ring shaped part formed at a place where the mountain part and the valley part are alternately connected in plurality; and a couple of power feed parts penetrating the insulating body and fixed to the insulating body and respectively connected to both ends of the ring shaped part;

wherein a width of the holding body receiving part may be set to increase as it goes away from the couple of power feed parts.

Preferably, the heating element may comprise a ring shaped part formed at a place where the mountain part and the valley part are alternately connected in plurality, and a couple of power feed parts penetrating the insulating body and fixed to the insulating body and respectively connected to both ends of the ring shaped part;

the insulating body may comprise a storage part in an inner circumferential surface of the insulating body, and the storage part may have a tube shape in a manner of surrounding an outer circumferential surface of the ring shaped part, and may have a groove shape receiving the ring shaped part;

front ends of the mountain parts of the ring shaped part may be inclined respectively at obtuse angles from a middle part except for the front ends of the mountain parts of the ring shaped part such that the front ends of the mountain parts of the ring shaped part are directed to a center of the ring shaped part;

both side walls of the storage part may be inclined respectively at obtuse angles from a bottom surface of the storage part; and the angles at which the front ends of the mountain parts may be inclined and the angles at which both the side walls of the storage part are inclined may be set to be identical.

Preferably, the bottom surface of the storage part may have a width larger than that of the middle part except for the front ends of the mountain parts of the ring shaped part, and the heating device may comprise a stepped part having a width less than that of the middle part, in the bottom surface of the storage part.

Preferably, the heating element may comprise a ring shaped part formed at a place where the mountain part and the valley part are alternately connected in plurality, and a couple of power feed parts penetrating the insulating body and fixed to the insulating body and respectively connected to both ends of the ring shaped part, the insulating body may comprise a storage part in an inner circumferential surface of the insulating body, and the storage part may be formed in a tube shape in a manner of surrounding an outer circumferential surface of the ring shaped part, and may have a groove shape receiving the ring shaped part; and a distance between a bottom surface of the storage part and a middle part except for front ends of the mountain part of the ring shape part adjacent to the bottom surface may be set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

Preferably, the distance may be set to increase as it goes away from the couple of power feed parts.

(Supplementary Note 5)

According to another preferred embodiment of the present invention, there is provided a method of manufacturing a semiconductor device, the method comprising:

loading a substrate into a process chamber installed in a heating device; and increasing temperature of a heating element provided to the heating device to heat the substrate in the process chamber in a state where both ends of the heating element including a mountain part and a valley part that are alternately connected in plurality in a meander shape are fixed to an insulating body installed at an outer circumference of the heating element, and simultaneously, holding bodies are disposed in holding body receiving parts respectively installed at ends of the valley parts and formed as cutout parts having a width larger than a width of the valley part, and are fixed to the insulating body, so as to hold a position of the heating element.

(Supplementary Note 6)

According to another preferred embodiment of the present invention, there is provided a heating device comprising:

a heating element including a ring shaped part formed at a place where a mountain part and a valley part are alternately connected in plurality; and an insulating body including a storage part in an inner circumferential surface of the insulating body, and the storage part has a tube shape in a manner of surrounding an outer circumferential surface of the ring shaped part, and has a groove shape receiving the ring shaped part, wherein the heating element includes a couple of power feed parts penetrating the insulating body and fixed to the insulating body and respectively connected to both ends of the ring shaped part, front ends of the mountain parts of the ring shaped part is inclined respectively at obtuse angles from a middle part except for the front ends of the mountain parts of the ring shaped part such that the front ends of the mountain parts of the ring shaped part are directed to a center of the ring shaped part, both side walls of the storage part are inclined respectively at obtuse angles from a bottom surface of the storage part, and the angles at which the front ends of the mountain parts are inclined and the angles at which both the side walls of the storage part are inclined are set to be identical.

Preferably, the bottom surface of the storage part may have a width larger than that of the middle part, and the heating device may comprise a stepped part having a width less than that of the middle part, in the bottom surface of the storage part.

(Supplementary Note 7)

According to another preferred embodiment of the present invention, there is provided a heating device comprising:

a heating element including a ring shaped part formed at a place where a mountain part and a valley part are alternately connected in plurality; and an insulating body including a storage part in an inner circumferential surface of the insulating body, and the storage part has a tube shape in a manner of surrounding an outer circumferential surface of the ring shaped part, and has a groove shape receiving the ring shaped part, wherein the heating element includes a couple of power feed parts penetrating the insulating body and fixed to the insulating body and respectively connected to both ends of the ring shaped part, and a distance between a bottom surface of the storage part and a middle part except for front ends of the mountain part of the ring shape part adjacent to the bottom surface is set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

What is claimed is:

1. A heating device comprising:
   a heating element including a plurality of mountain parts consecutively connected to form a meander shape, each mountain part, of the plurality of mountain parts, including a front end and a holding body receiving part,
   wherein the front end of the mountain part is bent at an obtuse angle with respect to a portion of the mountain art other than the front end of the mountain part, and
   wherein a width of the holding body receiving part is larger than a width of a space between two adjacent mountain parts of the plurality of mountain parts;
   an insulating body surrounding the heating element and comprising a groove disposed on an inner circumferential surface thereof to accommodate the heating element,
   wherein a first sidewall and a second sidewall of the groove are respectively inclined at the obtuse angle with respect to a bottom surface of the groove such that the groove accommodates the heating element; and
   a holding body disposed in the holding body receiving part and fixing the heating element to the insulating body,
   wherein two ends of the heating element are fixed to the insulating body.

2. The heating device of claim 1, wherein a distance between the bottom surface of the groove and each of the plurality of mountain parts adjacent to the bottom surface is set according to a position with respect to the two ends of the heating element.

3. The heating device of claim 2, wherein the distance varies in at least one portion of the heating element when the heating element is at a room temperature.

4. The heating device of claim 3, wherein the distance is identical for each of the plurality of mountain parts when the heating element is at a substrate processing temperature.

5. The heating device of claim 1, wherein the width of the holding body receiving part increases as a distance between the holding body receiving part and the two ends of the heating element increases to suppress an interference between the holding body receiving part and the holding body caused by thermal expansion of the heating element.

6. The heating device of claim 1, wherein a position of the holding body in the holding body receiving part is set according to a position of the holding body receiving part with respect to the two ends of the heating element.

7. A substrate processing apparatus comprising:
   a heating device; and
   a process chamber installed in the heating device to process a substrate,
   wherein the heating device comprises:
   a heating element including a plurality of mountain parts consecutively connected to form a meander shape, each mountain part, of the plurality of mountain parts, including a front end and a holding body receiving part,
   wherein the front end of the mountain part is bent at an obtuse angle with respect to a portion of the mountain part other than the front end of the mountain part, and
   wherein a width of the holding body receiving part is larger than a width of a space between two adjacent mountain parts of the plurality of mountain parts;
   an insulating body surrounding the heating element and comprising a groove disposed on an inner circumferential surface thereof to accommodate the heating element,
   wherein a first sidewall and a second sidewall of the groove are respectively inclined at the obtuse angle with respect to a bottom surface of the groove such that the groove accommodates the heating element; and
   a holding body disposed in the holding body receiving part and fixing the heating element to the insulating body,
   wherein two ends of the heating element are fixed to the insulating body.

* * * * *